(12) United States Patent
Mun et al.

(10) Patent No.: US 12,538,551 B2
(45) Date of Patent: Jan. 27, 2026

(54) SEMICONDUCTOR STRUCTURES FOR GALVANIC ISOLATION

(71) Applicant: GlobalFoundries Singapore Pte. Ltd., Singapore (SG)

(72) Inventors: Bong Woong Mun, Singapore (SG); Jeoung Mo Koo, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 128 days.

(21) Appl. No.: 18/366,711

(22) Filed: Aug. 8, 2023

(65) Prior Publication Data

US 2023/0387223 A1 Nov. 30, 2023

Related U.S. Application Data

(62) Division of application No. 17/335,091, filed on Jun. 1, 2021, now Pat. No. 11,764,273.

(51) Int. Cl.
*H10D 64/00* (2025.01)
*H10D 1/68* (2025.01)
*H10D 62/10* (2025.01)

(52) U.S. Cl.
CPC ............ *H10D 64/117* (2025.01); *H10D 1/68* (2025.01); *H10D 1/692* (2025.01); *H10D 62/113* (2025.01)

(58) Field of Classification Search
CPC ........ H10D 64/117; H10D 1/68; H10D 1/692; H10D 62/113
See application file for complete search history.

(56) References Cited

U.S. PATENT DOCUMENTS

| | | | |
|---|---|---|---|
| 6,420,749 B1 | 7/2002 | Divakaruni et al. | |
| 7,960,783 B2* | 6/2011 | Darwish | H10D 64/118 257/330 |
| 8,957,500 B2 | 2/2015 | Dubois et al. | |
| 9,299,697 B2 | 3/2016 | West et al. | |
| 2008/0303086 A1* | 12/2008 | Ueda | H10D 84/0135 438/270 |
| 2016/0111488 A1* | 4/2016 | Lu | H10D 64/117 438/270 |
| 2017/0025532 A1* | 1/2017 | Mori | H01L 21/02233 |
| 2018/0082997 A1* | 3/2018 | Li | H10D 84/0191 |
| 2018/0138322 A1* | 5/2018 | Dun | H10D 8/60 |
| 2019/0027592 A1 | 1/2019 | Tanabe | |
| 2020/0212218 A1* | 7/2020 | Kim | H10D 62/107 |
| 2022/0223729 A1 | 7/2022 | Kondo | |

* cited by examiner

*Primary Examiner* — Joseph C. Nicely

(74) *Attorney, Agent, or Firm* — Francois Pagette

(57) ABSTRACT

The present disclosure generally relates to semiconductor structures for capacitive isolation, and structures incorporating the same. More particularly, the present disclosure relates to capacitive isolation structures for high voltage applications. The present disclosure also relates to methods of forming structures for capacitive isolation and the structures incorporating the same. The disclosed semiconductor structures may enable a smaller device footprint and reduced dimensions of components on an IC chip, whilst ensuring galvanic isolation between circuits.

18 Claims, 17 Drawing Sheets

SEMICONDUCTOR STRUCTURES FOR GALVANIC ISOLATION

FIELD OF THE INVENTION

The disclosed subject matter relates generally to semiconductor structures for galvanic isolation, and devices incorporating the same. More particularly, the present disclosure relates to capacitive isolation structures for high voltage applications. The present disclosure also relates to methods of forming the structures for galvanic isolation and devices incorporating the same.

BACKGROUND

The semiconductor industry's drive for higher density, higher performance, lower-cost devices and the implementation of nanometer-scale process nodes have resulted in the development of integrated circuit (IC) chips with smaller and more complex circuits. For IC chips that have both high voltage and low voltage components, galvanic isolation can provide a way for transmitting a signal from one electrical circuit to another electrical circuit while electrically isolating the two electrical circuits from one another. Galvanic isolation may be further categorized into opto-isolation, capacitive isolation, magnetic isolation, and radio frequency-based isolation depending on the technology used to electrically isolate the current.

Capacitive isolation for power applications may require the provision of a capacitor capable of resisting high voltage supplied into the chip. An example of providing capacitive isolation may include the formation of numerous dielectric material layers stacked vertically on top of each other. However, as the industry demands for higher operating voltages, reduced dimensions of devices on an IC chip, and increased density of fabricated devices in a given region, several space and layout constraints have surfaced in order to provide sufficient galvanic isolation in the chip.

SUMMARY

In an aspect of the present disclosure, there is provided a semiconductor structure including a first isolation structure in a substrate, the first isolation structure including a first electrode, an isolation layer in the substrate, the isolation layer has an upper surface and is positioned laterally adjacent to the first isolation structure, and a second electrode above the isolation layer, the second electrode has a surface that is substantially parallel with the upper surface of the isolation layer, in which the second electrode is isolated from the first electrode by the isolation layer.

In another aspect of the present disclosure, there is provided a semiconductor structure including a first isolation structure in a substrate, the first isolation structure including a first electrode, an isolation layer in the substrate, the isolation layer has an upper surface and is positioned laterally adjacent to the first isolation structure, a second electrode above the isolation layer, the second electrode has a surface that is substantially parallel with the upper surface of the isolation layer, in which the second electrode is isolated from the first electrode by the isolation layer, and a conductive element disposed upon the upper surface of the isolation layer, in which the conductive element is positioned below the second electrode, and the conductive element is electrically connected to the second electrode.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
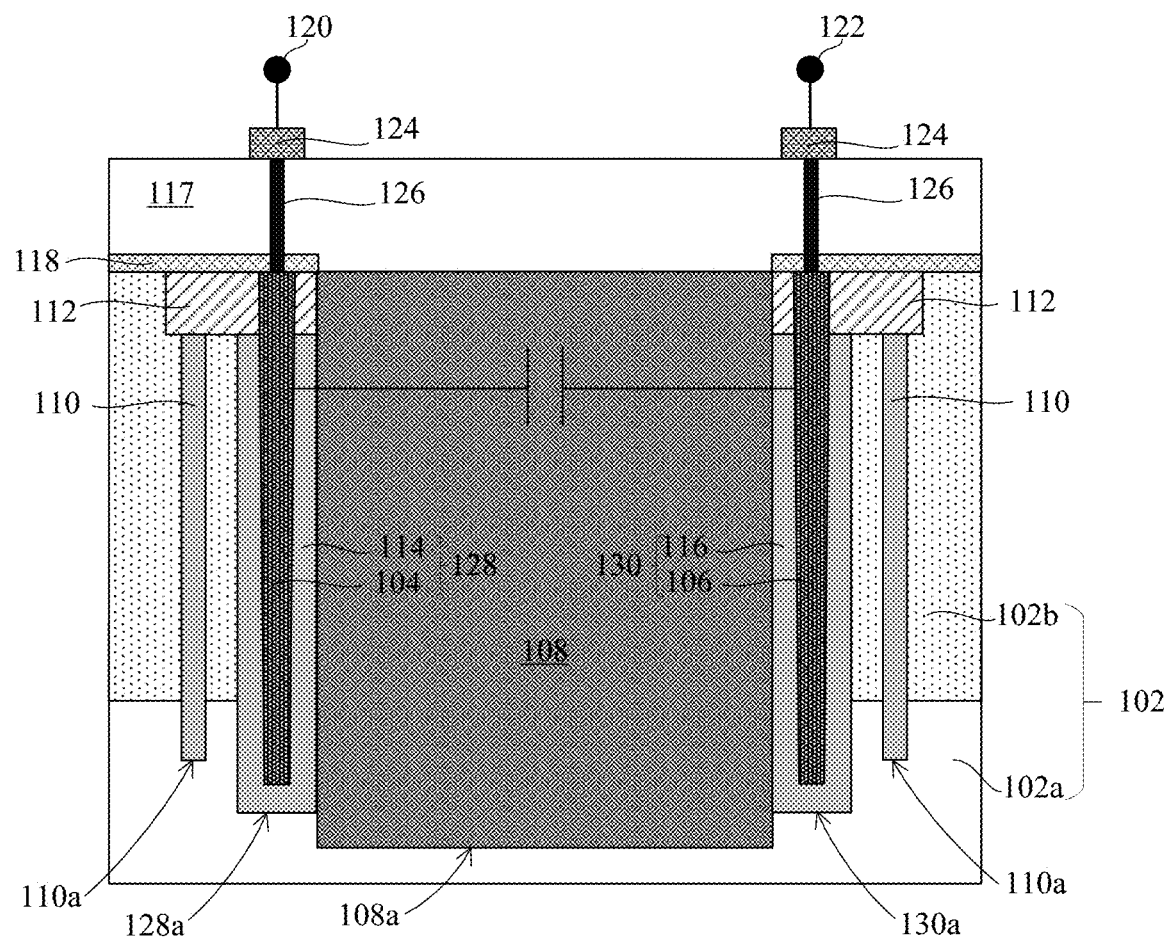
FIG. 1A is a cross-sectional view of an example of a semiconductor structure for capacitive isolation.
Figure 1B:
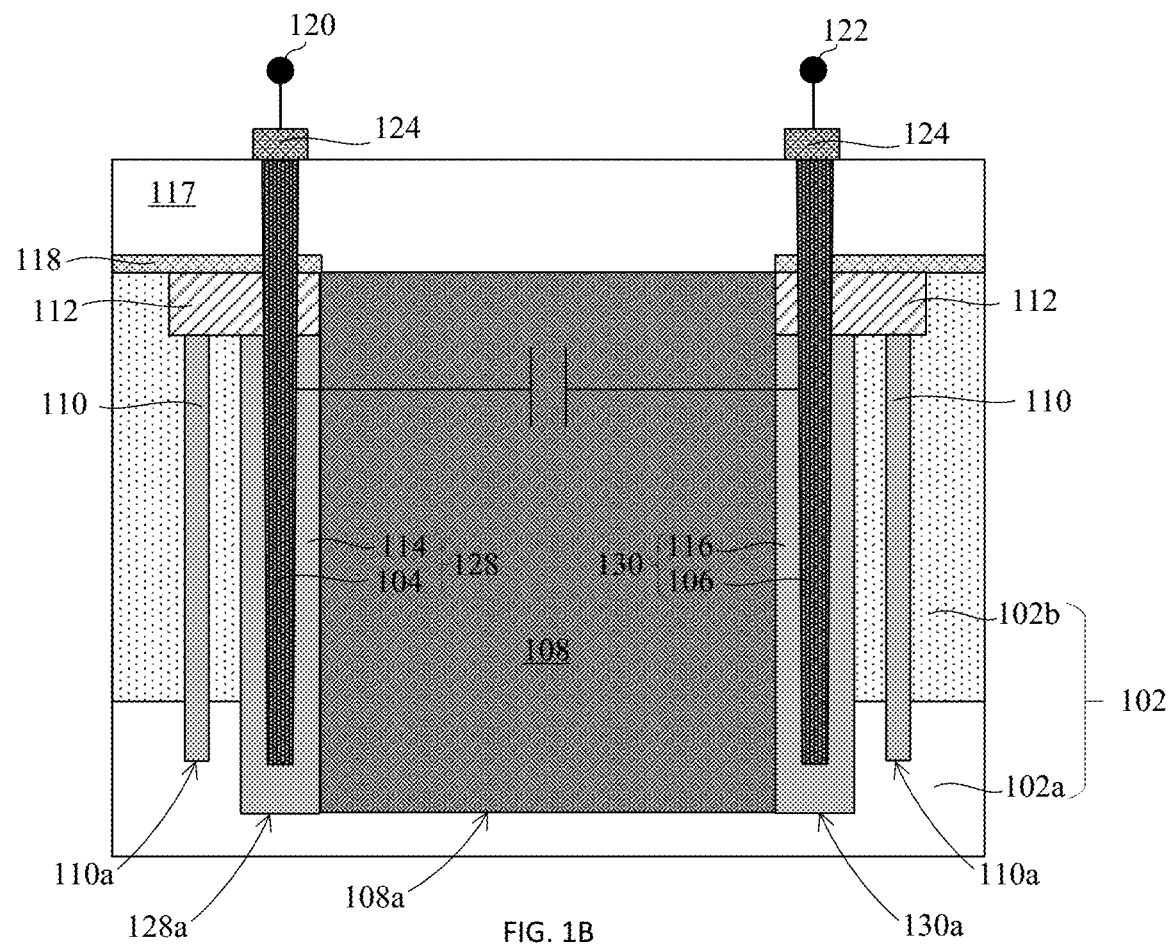
FIG. 1B is a cross-sectional view of another example of a semiconductor structure for capacitive isolation.
Figure 1C:
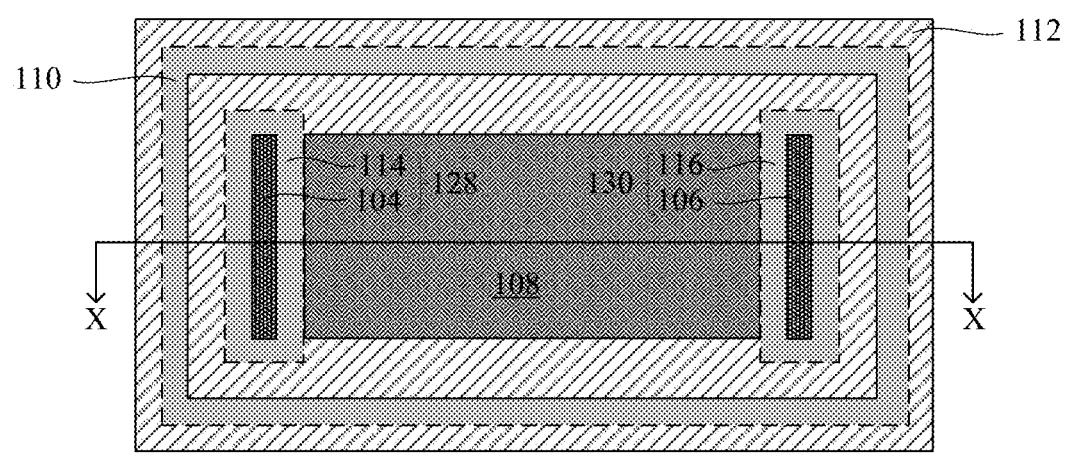
FIG. 1C is a top-down view of the semiconductor structures shown in FIG. 1A and FIG. 1B.

Referring to FIG. 1A, FIG. 1B, and FIG. 1C, there are provided examples of a semiconductor structure for capacitive isolation. Line XX in FIG. 1C indicates the cross-section from which the views in FIG. 1A and FIG. 1B are taken from. The semiconductor structure may include a substrate 102, a first isolation structure 128 disposed in the substrate 102, a second isolation structure 130 disposed in the substrate 102, and an isolation layer 108 disposed in the substrate 102. The first isolation structure 128 may include a first electrode 104 and a first dielectric liner 114 covering sides and a bottom surface of the first electrode 104. The second isolation structure 130 may include a second electrode 106 and a second dielectric liner 116 covering sides and a bottom surface of the second electrode 106. In the embodiment shown in FIG. 1A, the first electrode 104 and the second electrode 106 may have upper surfaces that are substantially coplanar with an upper surface of the substrate 102. In the embodiment shown in FIG. 1B, the first electrode 104 and the second electrode 106 may have upper surfaces that are above an upper surface of the substrate 102.

The substrate 102 may be made of any semiconductor material, such as silicon, germanium, silicon germanium (SiGe), silicon carbide, and those consisting essentially of III-V compound semiconductors, such as GaAs, II-VI compound semiconductors such as ZnSe. The substrate 102 may be amorphous, polycrystalline, or monocrystalline. The substrate 102 may include one or more active regions, e.g., regions for current flow, and may be doped. In some embodiments, the substrate 102 may include an epitaxial region 102b formed above a doped well 102a. The epitaxial region 102b may be doped with either P-type conductivity or N-type conductivity. The doped well 102a may have either P-type conductivity or N-type conductivity. Exemplary dopants for N-type conductivity doping may include, but are not limited to, arsenic, phosphorus, or antimony. Exemplary dopants for P-type conductivity doping may include, but are not limited to, boron, aluminum, or gallium. In some embodiments, the doped well 102a and the epitaxial region 102b may have the same doping conductivity.

The first dielectric liner 114 and the second dielectric liner 116 may function as electrical insulators for the first electrode 104 and the second electrode 106, respectively. The first dielectric liner 114 and the second dielectric liner 116 may include an oxide or a nitride and may prevent unwanted electrical shorts between the electrodes 104, 106 and the substrate 102 (e.g., the epitaxial region 102b and the doped well 102a). Examples of oxides for the dielectric liners 114, 116 may include, but are not limited to, silicon dioxide, silicon oxynitride, tetraethyl orthosilicate (TEOS), or silicon-rich silicon oxide. Examples of nitrides for the dielectric liners 114, 116 may include, but are not limited to, silicon nitride, or silicon oxynitride.

The first electrode 104 and the second electrode 106 may be made of a conductive material. In an example, the first electrode 104 and the second electrode 106 may be made of the same material. Alternatively, the first electrode 104 may be made of a different material than the second electrode 106. Examples of the conductive material used to make the first electrode 104 and the second electrode 106 may include, but not limited to, a crystalline material such as polycrystalline silicon, amorphous silicon, polycrystalline germanium, amorphous germanium, polycrystalline silicon-germanium, or amorphous silicon-germanium, or a metallic material such as tungsten, cobalt, nickel, copper, aluminum, or an alloy thereof. The first electrode 104 and the second electrode 106 may also be structured as conductive plates. For example, the first electrode 104 may have a first surface and the second electrode 106 may have a second surface that is substantially parallel with the first surface of the first electrode 104.

A shallow trench isolation layer 112 may be disposed in the substrate 102 and formed above the first isolation structure 128 and the second isolation structure 130. In an example, the first isolation structure 128 and the second isolation structure 130 may be structured as deep trench isolation structures. The first isolation structure 128 and the second isolation structure 130 may have relatively larger depths and extend deeper into the substrate 102 as compared to the shallow trench isolation layer 112. The shallow trench isolation layer 112 may include an oxide (e.g., silicon dioxide) and serve as an electrical insulator to prevent electrical shorts between the active regions in the substrate 102 and the electrodes 104, 106.

The semiconductor structure may further include a dielectric isolation trench 110 disposed in the substrate 102. The dielectric isolation trench 110, the first isolation structure 128, and the second isolation structure 130 may extend from a bottom of the shallow trench isolation layer 112 and terminate in the substrate 102. In an embodiment, the dielectric isolation trench 110, the first isolation structure 128, and the second isolation structure 130 may have bottom surfaces that are located below the epitaxial region 102b and within the doped well 102a of the substrate 102. The dielectric isolation trench 110 may have a relatively smaller depth as compared to the first isolation structure 128 and the second isolation structure 130. For example, the dielectric isolation trench 110 may have a bottom surface 110a that is higher than a bottom surface 128a of the first isolation structure 128 and a bottom surface 130a of the second isolation structure 130.

The first isolation structure 128 and the second isolation structure 130 may have depths measured from the upper surface of the substrate 102 to their respective bottom surfaces 128a, 130a. In some embodiments, the first isolation structure 128 and the second isolation structure 130 may have depths in the range of about 20 μm to about 40 μm.

The first electrode 104 may be in electrical communication with a first circuit 120 and the second electrode 106 may be in electrical communication with a second circuit 122 that operates at a different voltage than the first circuit 120. For example, the first circuit 120 may operate at a lower voltage than the second circuit 122. As shown in FIG. 1A, the first electrode 104 and the second electrode 106 may be in electrical communication with the first circuit 120 and the second circuit 122, respectively, through conductive lines 124 and contact structures 126. Alternatively, as shown in FIG. 1B, the first electrode 104 and the second electrode 106 may extend above the substrate 102 to directly contact the conductive lines 124 (i.e., contact structures 126 may not be needed).

The isolation layer 108 may be positioned laterally between the first isolation structure 128 and the second isolation structure 130. The first electrode 104 may be electrically isolated from the second electrode 106 by the isolation layer 108. The isolation layer 108 may prohibit or substantially prohibit transmission (or flowing) of electrical current between the first electrode 104 and the second electrode 106, thereby maintaining electrical isolation between the first circuit 120 and second circuit 122. The first electrode 104 may be capacitively coupled to the second electrode 106. The isolation layer 108 may additionally allow transmission of a capacitively coupled signal between the first electrode 104 and the second electrode 106, thereby enabling communication between the first circuit 120 and the second circuit 122 even though the first circuit 120 and the second circuit 122 are electrically isolated from one another.

The isolation layer 108 may include a dielectric material such as, but not limited to, silicon dioxide, tetraethyl orthosilicate (TEOS), or a material having a chemical composition of $SiC_xO_yH_z$, wherein x, y, and z are in stoichiometric ratio. The isolation layer 108 may have a bottom surface 108a that is either substantially coplanar with or lower than the bottom surface 128a of the first isolation structure 128 and the bottom surface 130a of the second isolation structure 130.

A passivation liner 118 may be formed on the substrate 102 and covers the shallow trench isolation layer 112 and the epitaxial region 102b of the substrate 102. An inter-metal dielectric (IMD) layer 117 may be disposed upon the substrate 102 and the passivation liner 118. The IMD layer 117 may include a dielectric material such as, but not limited to, silicon dioxide, tetraethyl orthosilicate (TEOS), or a material having a chemical composition of $SiC_xO_yH_z$, wherein x, y, and z are in stoichiometric ratio. In an embodiment, the IMD layer 117 and the isolation layer 108 may include the same dielectric material.

FIG. 1C illustrates the relative positioning of the first electrode 104, the first dielectric liner 114, the second electrode 106, the second dielectric liner 116, the isolation layer 108, and the dielectric isolation trench 110. The first isolation structure 128, the second isolation structure 130, and the dielectric isolation trench 110 are outlined by a broken-lined rectangle to illustrate that those features are positioned below the shallow trench isolation layer 112. For simplicity, the IMD layer 117, the passivation liner 118, the contact structure 126, and the conductive lines 124 are not shown.

As shown in FIG. 1C, the dielectric isolation trench 110 may laterally enclose the first isolation structure 128, the isolation layer 108, and the second isolation structure 130. Although FIG. 1C illustrates the dielectric isolation trench 110 as having a rectangular shape, it should be understood that the dielectric isolation trench 110 may alternatively have a polygonal (e.g., pentagonal, hexagonal, heptagonal, octagonal, nonagonal, decagonal, etc.), circular, elliptical, or oval shape.

Figure 2A:
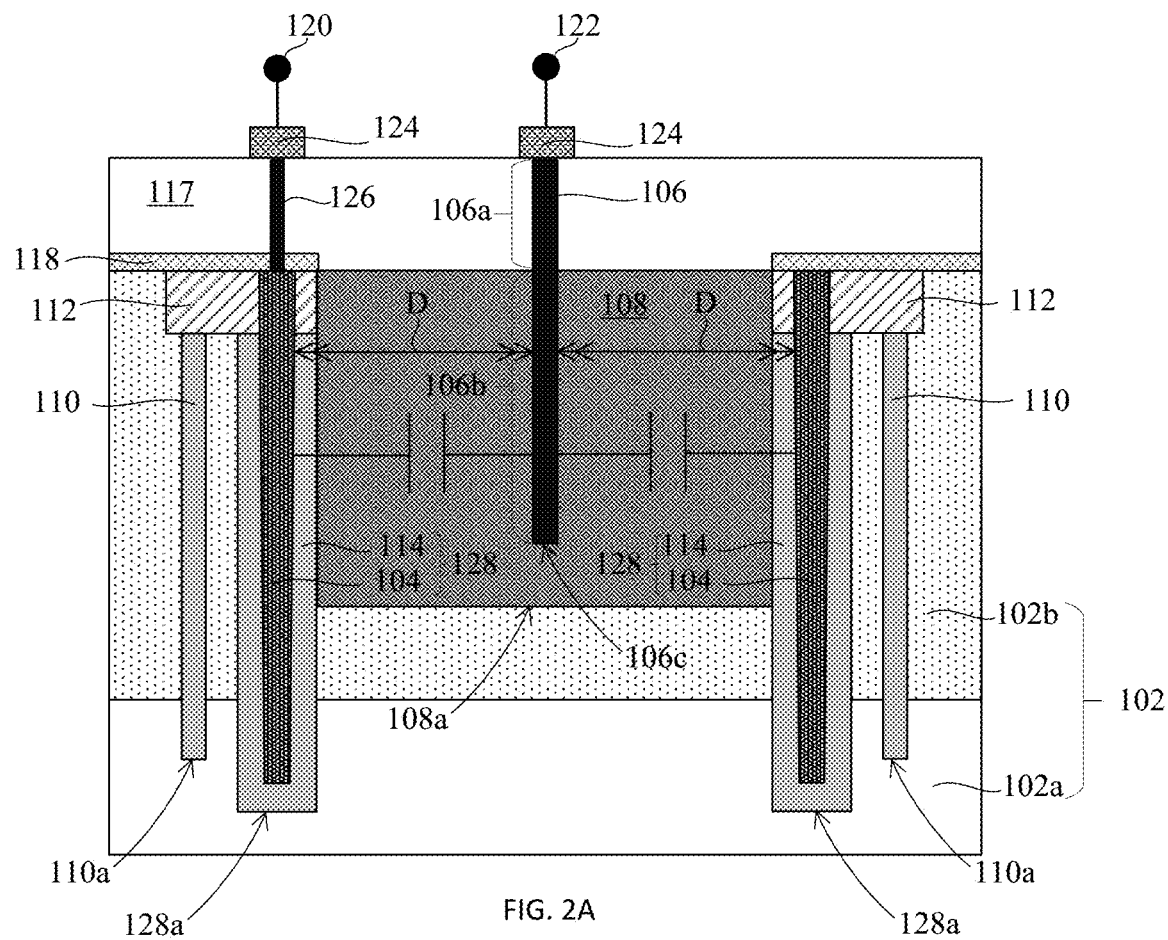
FIG. 2A is a cross-sectional view of another example of a semiconductor structure for capacitive isolation.
Figure 2B:
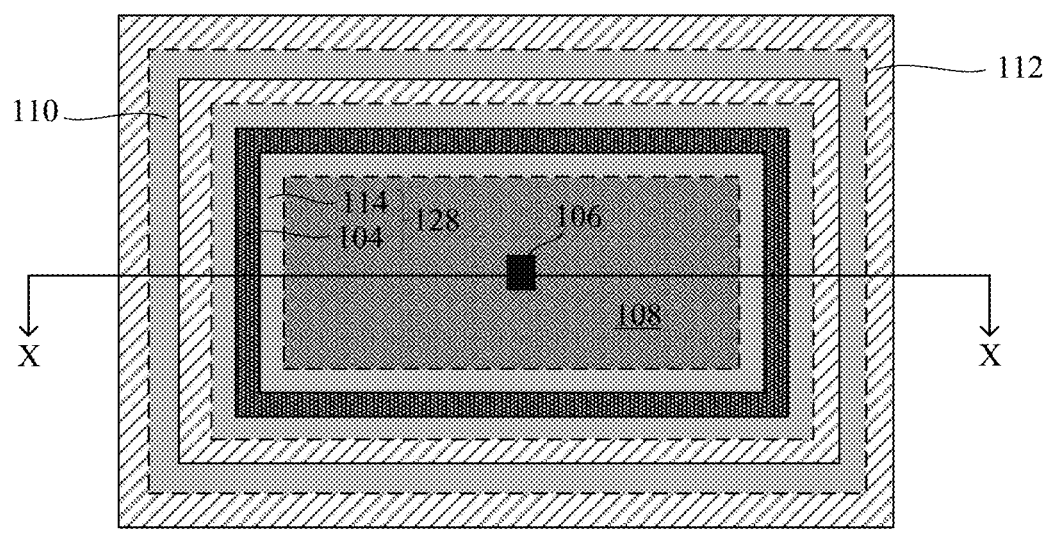
FIG. 2B is a top-down view of the semiconductor structure shown in FIG. 2A.

Referring to FIG. 2A and FIG. 2B, in which like reference numerals refer to like features in FIG. 1A and FIG. 1C, respectively, another example of a semiconductor structure for capacitive isolation is shown. Line XX in FIG. 2B indicates the cross-section from which the view in FIG. 2A is taken from. The semiconductor structure may include a substrate 102, a first isolation structure 128 disposed in the substrate 102, and an isolation layer 108 disposed in the substrate 102. The first isolation structure 128 may include a first electrode 104 and a first dielectric liner 114 covering sides and a bottom surface of the first electrode 104. The semiconductor structure may further include a second electrode 106 at least partially disposed in the isolation layer 108. For example, as shown in FIG. 2A, the second electrode 106 may have a lower portion 106b disposed in the isolation layer 108 and an upper portion 106a extending above the isolation layer 108. Alternatively, in another example (not shown), the second electrode 106 may be fully disposed in the isolation layer 108. In some embodiments, the lower portion 106b of the second electrode 106 may extend into the isolation layer 108 by a depth of about 2 μm to about 10 μm. Depending on the operating voltage of the device, the isolation layer 108 may have a depth in the range of about 6 μm to about 22.5 μm. In an embodiment, the second electrode 106 may be structured as a rod having a substantially vertical orientation. Alternatively, the second electrode 106 may be structured as a plate having a substantially vertical orientation.

As described herein, a shallow trench isolation layer 112 and a dielectric isolation trench 110 may be disposed in the substrate 102. The dielectric isolation trench 110 and the first isolation structure 128 may extend from a bottom of the shallow trench isolation layer 112 and terminate in the substrate 102. The substrate 102 may include an epitaxial region 102b formed above a doped well 102a. In an embodiment, the dielectric isolation trench 110 and the first isolation structure 128 may have bottom surfaces that are located below the epitaxial region 102b and within the doped well 102a of the substrate 102. The dielectric isolation trench 110 may have a relatively smaller depth as compared to the first isolation structure 128. For example, the dielectric isolation trench 110 may have a bottom surface 110a that is higher than a bottom surface 128a of the first isolation structure 128.

The first isolation structure 128 may have a depth measured from the upper surface of the substrate 102 to its bottom surface 128a. In some embodiments, the first isolation structure 128 may have a depth in the range of about 20 μm to about 40 μm.

The first electrode 104 may be in electrical communication with a first circuit 120 and the second electrode 106 may be in electrical communication with a second circuit 122 that operates at a different voltage than the first circuit 120. For example, the first circuit 120 may operate at a lower voltage than the second circuit 122. As shown in FIG. 2A, the first electrode 104 may be in electrical communication with the first circuit 120 through a conductive line 124 and a contact structure 126. Alternatively, in another example (not shown), the first electrode 104 may extend above the substrate 102 to directly contact the conductive lines 124 (i.e., contact structures 126 may not be needed). The second electrode 106 may be in electrical communication with the second circuit 122 by extending above the isolation layer 108 to directly contact a conductive line 124. Alternatively, in another example (not shown), where the second electrode 106 is fully disposed in the isolation layer 108, a contact structure may be formed upon the second electrode 106 and being connected to the conductive line 124.

The isolation layer 108 may be positioned laterally between the first isolation structure 128 and the second electrode 106. The first electrode 104 may be electrically isolated from the second electrode 106 by the isolation layer 108. The isolation layer 108 may prohibit or substantially prohibit transmission (or flowing) of electrical current between the first electrode 104 and the second electrode 106, thereby maintaining electrical isolation between the first circuit 120 and second circuit 122. The first electrode 104 may be capacitively coupled to the second electrode 106. The isolation layer 108 may additionally allow transmission of a capacitively coupled signal between the first electrode 104 and the second electrode 106, thereby enabling communication between the first circuit 120 and the second circuit 122 even though the first circuit 120 and the second circuit 122 are electrically isolated from one another. In some embodiments, depending on the magnitude of voltage used to operate the device, the second electrode 106 may be laterally spaced apart from the first electrode 104 by a distance D in the range of about 4 μm to about 11.5 μm.

The second electrode 106 may have a bottom surface 106c that is higher than the bottom surface 128a of the first isolation structure 128 and the bottom surface 110a of the dielectric isolation trench 110. As shown in FIG. 2A, the isolation layer 108 may have a bottom surface 108a that is lower than the bottom surface 106c of the second electrode 106. In yet another embodiment, the distance between the bottom surface 106c of the second electrode 106 and the bottom surface 108a of the isolation layer 108 may have the same value as the distance D between the first electrode 104 and the second electrode 106.

FIG. 2B illustrates the relative positioning of the first electrode 104, the first dielectric liner 114, the second electrode 106, the isolation layer 108, and the dielectric isolation trench 110. The first isolation structure 128 and the dielectric isolation trench 110 are outlined by a broken-lined rectangle to illustrate that those features are positioned below the shallow trench isolation layer 112. For simplicity, the IMD layer 117, the passivation liner 118, the contact structures 126, and the conductive lines 124 are not shown.

As shown in FIG. 2B, the isolation layer 108 may be laterally enclosed by the first isolation structure 128, and the second electrode 106 may be laterally enclosed by the isolation layer 108. In particular, the first electrode 104 may form an enclosure around the second electrode 106. Although FIG. 2B illustrates the dielectric isolation trench 110 and the first isolation structure 128 as having a rectangular shape, it should be understood that the dielectric isolation trench 110 and the first isolation structure 128 may alternatively have a polygonal (e.g., pentagonal, hexagonal, heptagonal, octagonal, nonagonal, decagonal, etc.), circular, elliptical, or oval shape. In the embodiment shown in FIG. 2B, the second electrode 106 may be structured as a rod with a square cross-section. Alternatively, although not shown in the accompanying drawings, the second electrode 106 may alternatively be structured as a rod with either a circular or an elliptical cross-section. In the embodiment where the second electrode 106 is structured as a plate (not shown), the second electrode 106 may have a rectangular shape extending in the same orientation as the rectangular shape of the first isolation structure 128.

Figure 3A:
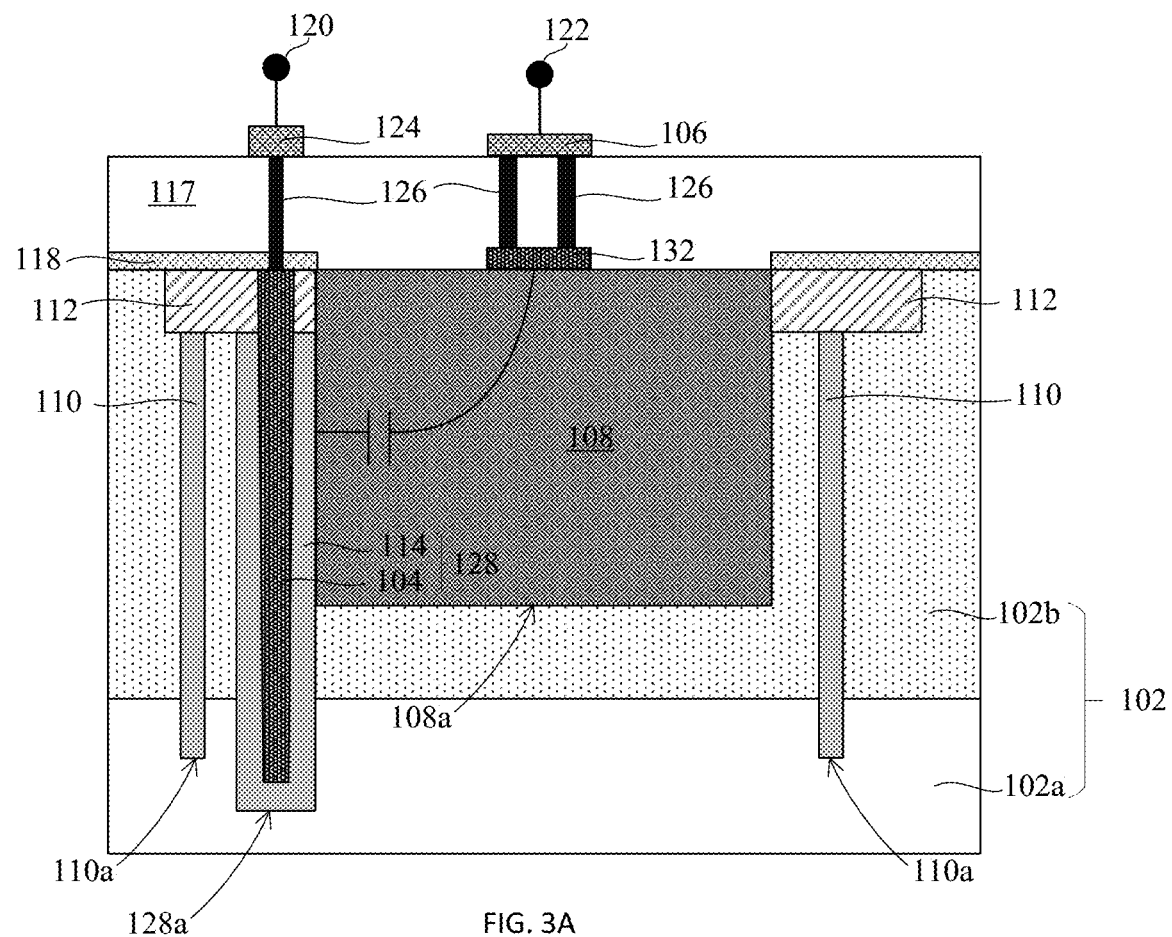
FIG. 3A is a cross-sectional view of another example of a semiconductor structure for capacitive isolation.
Figure 3B:
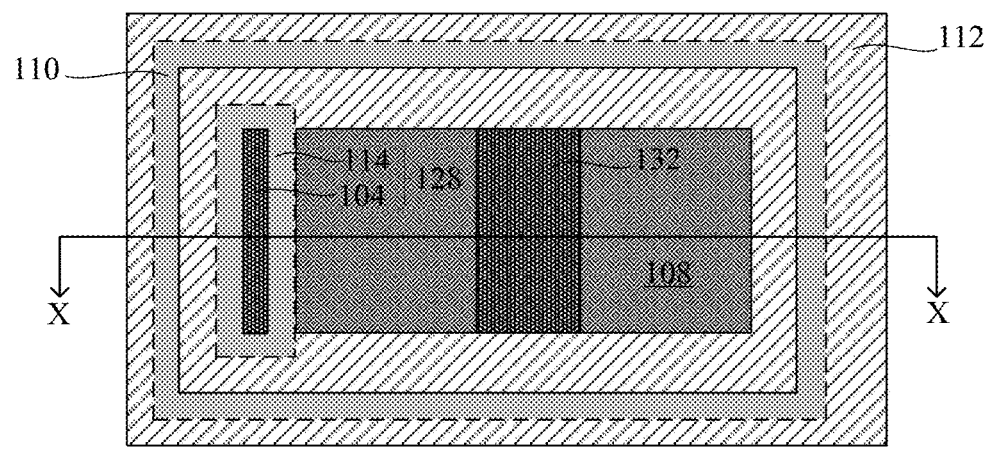
FIG. 3B is a top-down view of the semiconductor structure shown in FIG. 3A.

Referring to FIG. 3A and FIG. 3B, in which like reference numerals refer to like features in FIG. 2A and FIG. 2B, respectively, another example of a semiconductor structure for capacitive isolation is shown. Line XX in FIG. 3B indicates the cross-section from which the view in FIG. 3A is taken from. The semiconductor structure may include a substrate 102, a first isolation structure 128 disposed in the substrate 102, and an isolation layer 108 disposed in the substrate 102. The isolation layer 108 may be positioned laterally adjacent to the first isolation structure 128. The first isolation structure 128 may include a first electrode 104 and a first dielectric liner 114 covering sides and a bottom surface of the first electrode 104.

The semiconductor structure may further include a second electrode 106 above the isolation layer 108. In the embodiment shown in FIG. 3A, the second electrode 106 may be aligned directly above the isolation layer 108, in which a surface of the second electrode 106 may be substantially parallel with an upper surface of the isolation layer 108. A conductive element 132 may be disposed upon the isolation layer 108 and positioned below the second electrode 106. The conductive element 132 may be electrically connected to the second electrode 106 by contact structures 126. In an embodiment, the first electrode 104 may be structured as a conductive plate having a substantially vertical orientation, while the second electrode 106 and the conductive element 132 may be structured as conductive plates having substantially horizontal orientations. For example, the conductive element 132 may have a surface that is substantially parallel with a surface of the second electrode 106.

As described herein, a shallow trench isolation layer 112 and a dielectric isolation trench 110 may be disposed in the substrate 102. The dielectric isolation trench 110 and the first isolation structure 128 may extend from a bottom of the shallow trench isolation layer 112 and terminate in the substrate 102. The substrate 102 may include an epitaxial region 102b formed above a doped well 102a. In an embodiment, the dielectric isolation trench 110 and the first isolation structure 128 may have respective bottom surfaces that are located below the epitaxial region 102b and within the doped well 102a of the substrate 102. The dielectric isolation trench 110 may have a relatively smaller depth as compared to the first isolation structure 128. For example, the dielectric isolation trench 110 may have a bottom surface 110a that is higher than a bottom surface 128a of the first isolation structure 128.

The first isolation structure 128 may have a depth measured from the upper surface of the substrate 102 to its bottom surface 128a. In some embodiments, the first isolation structure 128 may have a depth in the range of about 20 μm to about 40 μm. The isolation layer 108 may have a bottom surface 108a that is in the epitaxial region 102b of the substrate 102. Although not shown in the accompanying drawings, the bottom surface 108a may alternatively be in the doped well 102a of the substrate 102.

The first electrode 104 may be in electrical communication with a first circuit 120 and the second electrode 106 may be in electrical communication with a second circuit 122 that operates at a different voltage than the first circuit 120. For example, the first circuit 120 may operate at a lower voltage than the second circuit 122. The first electrode 104 may be electrically isolated from the conductive element 132 by the isolation layer 108. The isolation layer 108 may prohibit or substantially prohibit transmission (or flowing) of electrical current between the first electrode 104 and the conductive element 132, thereby maintaining electrical isolation between the first circuit 120 and second circuit 122. The first electrode 104 may be capacitively coupled to the conductive element 132. The isolation layer 108 may additionally allow transmission of a capacitively coupled signal between the first electrode 104 and the conductive element 132, thereby enabling communication between the first circuit 120 and the second circuit 122 even though the first circuit 120 and the second circuit 122 are electrically isolated from one another.

As described herein, a passivation liner 118 may be formed on the substrate 102 and covers the shallow trench isolation layer 112 and the epitaxial region 102b of the substrate 102. An inter-metal dielectric (IMD) layer 117 may be disposed upon the substrate 102 and the passivation liner 118. The second electrode 106 may be formed either on or within the IMD layer 117. The conductive element 132 and the contact structures 126 may be embedded within the IMD layer 117.

FIG. 3B illustrates the relative positioning of the first electrode 104, the first dielectric liner 114, the conductive element 132, the isolation layer 108, and the dielectric isolation trench 110. The first isolation structure 128 and the dielectric isolation trench 110 are outlined by a broken-lined rectangle to illustrate that those features are positioned below the shallow trench isolation layer 112. For simplicity, the second electrode 106, the IMD layer 117, the passivation liner 118, the contact structures 126, the contact structures 126, and the conductive lines 124 are not shown.

As shown in FIG. 3B, the isolation layer 108 may be laterally adjacent to the first isolation structure 128. The conductive element 132 may be laterally displaced from the first isolation structure 128 so that a distance can be maintained between the conductive element 132 and the first isolation structure 128 to prevent unwanted electrical shorts.

Although FIG. 3B illustrates the dielectric isolation trench 110 as having a rectangular shape, it should be understood that the dielectric isolation trench 110 may alternatively have a polygonal (e.g., pentagonal, hexagonal, heptagonal, octagonal, nonagonal, decagonal, etc.), circular, elliptical, or oval shape.

Figure 4:
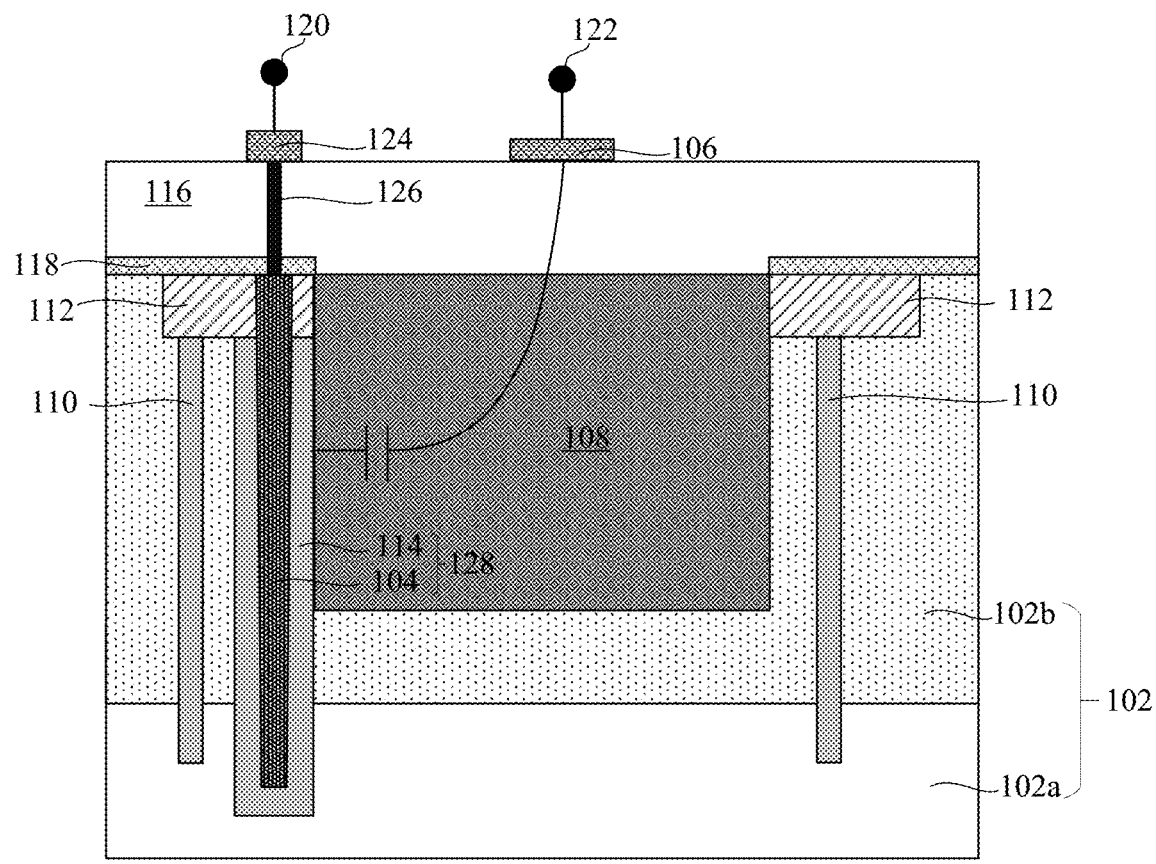
FIG. 4 is a cross-sectional view of another example of a semiconductor structure for capacitive isolation.

Referring to FIG. 4, in which like reference numerals refer to like features in FIG. 3A, another example of a semiconductor structure for capacitive isolation is shown. The embodiment shown in FIG. 4 is similar to the embodiment shown in FIG. 3A, except that in FIG. 4, the conductive element 132 may be absent, and a capacitively coupled signal may transmit between the second electrode 106 and the first electrode 104.

As shown, the semiconductor structure may include a substrate 102, a first isolation structure 128 disposed in the substrate 102, and an isolation layer 108 disposed in the substrate 102. The isolation layer 108 may be positioned laterally adjacent to the first isolation structure 128. The first isolation structure 128 may include a first electrode 104 and a first dielectric liner 114 covering sides and a bottom surface of the first electrode 104. The semiconductor structure may further include a second electrode 106 above the isolation layer 108. The second electrode 106 may be vertically spaced apart from the isolation layer 108. In the embodiment shown in FIG. 4, the second electrode 106 may be aligned directly above the isolation layer 108, in which a surface of the second electrode 106 may be substantially parallel with an upper surface of the isolation layer 108.

The first electrode 104 may be electrically isolated from the second electrode 106 by the isolation layer 108. The isolation layer 108 may prohibit or substantially prohibit transmission (or flowing) of electrical current between the first electrode 104 and the second electrode 106, thereby maintaining electrical isolation between the first circuit 120 and second circuit 122. The first electrode 104 may be capacitively coupled to the second electrode 106. The isolation layer 108 may additionally allow transmission of the capacitively coupled signal between the first electrode 104 and the second electrode 106, thereby enabling communication between the first circuit 120 and the second circuit 122 even though the first circuit 120 and the second circuit 122 are electrically isolated from one another.

Conventional capacitive isolation may be achieved by forming multiple layers of dielectric material stacked vertically on top of each other in the back end of line (BEOL) portion of an integrated circuit chip. However, for high voltage (e.g., more than 5.7 kV) applications, the number of layers needed to provide a thickness adequate for effective capacitive isolation becomes excessively large in terms of vertical stack height.

The disclosed semiconductor structures may enable a smaller device footprint and reduced dimensions of components on an IC chip, whilst ensuring galvanic isolation between circuits. With reference to FIG. 1A through FIG. 4, the second electrode 106 may be configured to transmit a signal sent from the second circuit 122 to the first electrode 104. The first electrode 104 may be configured to receive the transmitted signal from the second electrode 106. Direct current flow for transmitting the signal across the first electrode 104 and the second electrode 106 may not exist due to the presence of the isolation layer 108 and the dielectric liners 114, 116 in the respective isolation structures 128, 130. An electric field or electric flux may be generated across the first electrode 104 and the second electrode 106. The signal may be transmitted across from the second circuit 122 to the first circuit 120 via the electric field or the electric flux for capacitively coupling the signal between the first electrode 104 and the second electrode 106. Accordingly, capacitive isolation between the first electrode 104 and the second electrode 106 can be achieved without requiring multiple layers of dielectric material stacked vertically on top of one another.

Consequently, the transmitted signal may be received by the first circuit 120 through various interconnect structures, such as the contact structures 126 and the conductive lines 124. As will be shown in subsequent drawings, the first circuit 120 may include a transistor formed on the substrate 102, in which the first electrode 104 may be electrically connected to the transistor. The second circuit 122 may be formed on a different substrate than the first circuit 120. The first circuit 120 may be formed upon the same substrate as the substrate in which the first isolation structure 128 may be formed in.

Figure 5:
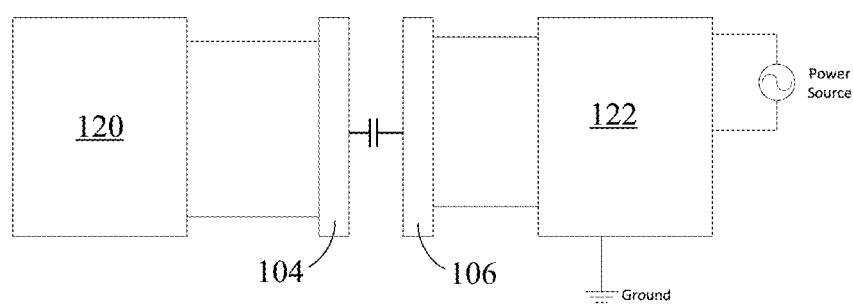
FIG. 5 is a circuit diagram of the semiconductor structures shown in FIG. 1A through FIG. 4.

FIG. 5 is a circuit diagram that illustrates the semiconductor structures shown in FIG. 1A through FIG. 4. As shown, the first circuit 120 may be connected to the first electrode 104 and the second circuit 122 may be connected to the second electrode 106. The second circuit 122 and the first circuit 120 may be formed on the same chip. Alternatively, the second circuit 122 and the first circuit 120 may be formed on different chips. The second circuit 122 may be supplied with a power source (e.g., an AC or a DC power source) and may operate at a higher voltage than the first circuit 120. For example, the second circuit 122 may include a high voltage power delivery system (not shown) having controllers and rectifiers. The first electrode 104 is electrically isolated from the second electrode 106, but transmission of capacitively coupled signals between the first electrode 104 and the second electrode 106 is allowed.

FIG. 6, FIG. 7, FIG. 8, and FIG. 9A show example structures associated with steps that may be used to create an example of a semiconductor device that incorporates the semiconductor structure shown in FIG. 1A.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure, or opening. Examples of techniques for patterning include, but not limited to, wet etch lithographic processes, dry etch lithographic processes, or direct patterning processes. Such techniques may use mask sets and mask layers.

Figure 6:
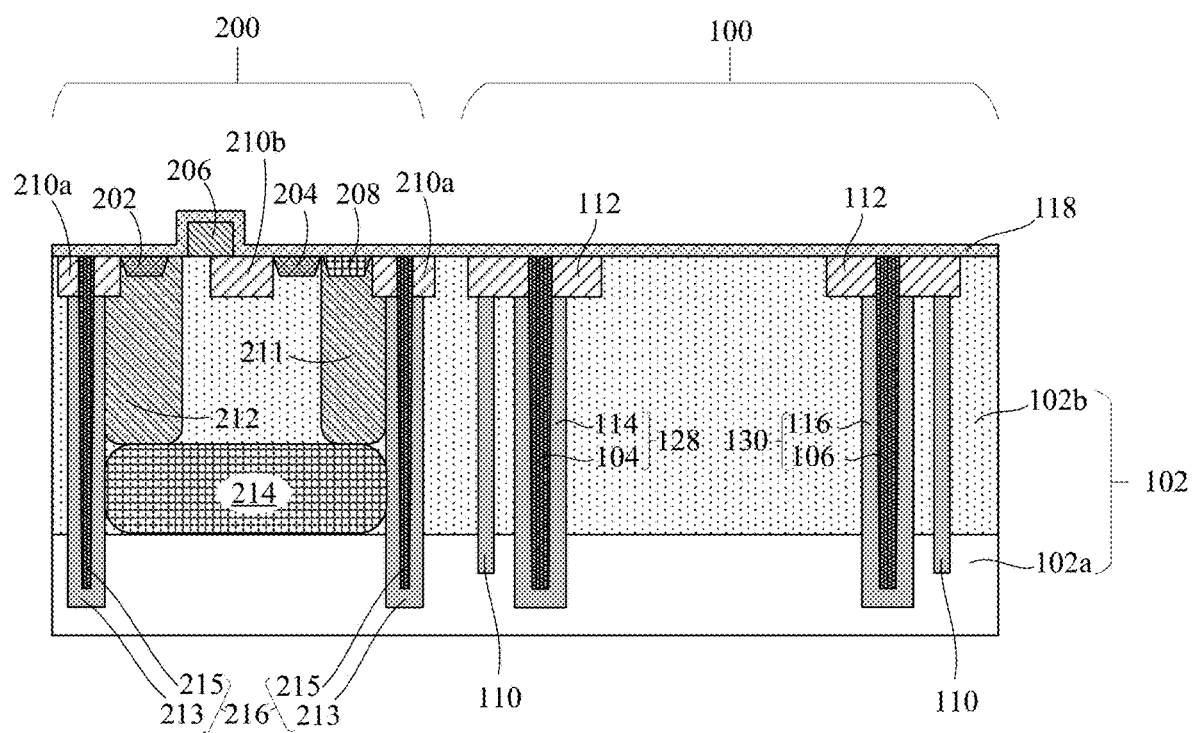
FIG. 6, FIG. 7, FIG. 8, and FIG. 9A are cross-sectional views that depict structures at various stages of forming a semiconductor device that integrates the semiconductor structure shown in FIG. 1A.

Referring to FIG. 6, a structure for forming the semiconductor device may be provided with a galvanic isolation region 100 and a device region 200. A passivation liner 118 may be formed on the substrate 102 to cover the galvanic isolation region 100 and the device region 200. The galvanic isolation region 100 and the device region 200 may be both formed on a substrate 102. The substrate 102 may include an epitaxial region 102b formed above a doped well 102a.

The galvanic isolation region 100 may include a shallow trench isolation layer 112 formed in the epitaxial region 102b. A first isolation structure 128, a second isolation structure 130, and a dielectric isolation trench 110 may be formed in the substrate 102. As shown in FIG. 6, the dielectric isolation trench 110, the first isolation structure 128, and the second isolation structure 130 may extend from a bottom of the shallow trench isolation layer 112, through the epitaxial region 102b, and terminate in the doped well 102a. The first isolation structure 128 may include a first electrode 104 and a first dielectric liner 114 covering sides and a bottom surface of the first electrode 104. The second isolation structure 130 may include a second electrode 106 and a second dielectric liner 116 covering sides and a bottom surface of the second electrode 106. In the embodiment shown in FIG. 6, the first electrode 104 and the second electrode 106 may have upper surfaces that are substantially coplanar with an upper surface of the substrate 102.

As described herein, the first circuit 120 may include a transistor formed on the substrate 102. The transistor in the first circuit 120 may be located in the device region 200. Examples of a transistor may include high voltage (HV) transistors, such as extended drain metal oxide semiconductor (EDMOS) transistors, or laterally diffused metal oxide semiconductor (LDMOS) transistors. In the device region 200, a body well 211, a source well 212, and a buried layer 214 may be formed in the epitaxial region 102b. The body well 211 and the source well 212 may be doped with the same conductivity as each other. The epitaxial region 102b may be doped with an opposite conductivity with respect to the body well and the source well 212. The buried layer 214 may also be doped and may be located below the body well 211 and the source well 212.

A source region 202 may be formed in the source well 212, a drain region 204 may be formed in the epitaxial region 102b, and a body region 208 may be formed in the body well 211. A gate 206 may be formed upon the epitaxial region 102b and located between the source region 202 and the drain region 204. Shallow trench isolation structures 210a, 210b may be formed in the epitaxial region 102b. One of the shallow trench isolation structures 210b may be located between the source region 202 and the drain region 204, and further located below and partially overlapping with the gate 206.

The device region 200 may be electrically isolated from other device components formed upon the substrate 102 by being laterally enclosed by a shallow trench isolation structure 210a and a deep trench isolation structure 216. The deep trench isolation structure 216 may extend from a bottom of the shallow trench isolation structure 210a, through the epitaxial region 102b, and terminate in the doped well 102a of the substrate 102. The deep trench isolation structure 216 may include a conductive structure 215 and a dielectric liner 213 covering sides and a bottom surface of the conductive structure 215.

Examples of the other device components (not shown) formed upon the substrate 102 may include diodes (e.g., a bi-directional diode, a single-photon avalanche diode, etc.) or transistors such as, but are not limited to, planar field-effect transistor, fin-shaped field-effect transistors (FinFETs), ferroelectric field-effect transistors (FeFETs), complementary metal-oxide semiconductor (CMOS) transistors, and bi-polar junction transistors (BJT).

Figure 7:
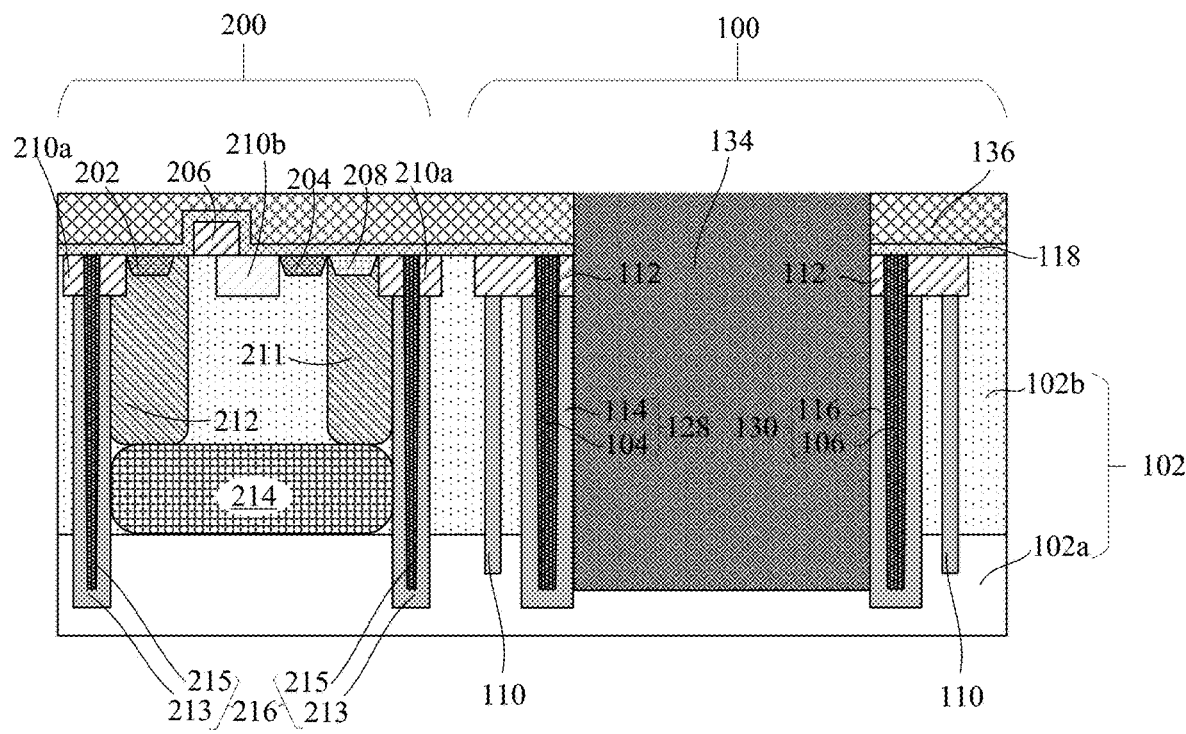

Referring to FIG. 7 (FIG. 7 continues from the structure shown in FIG. 6), a trench opening 134 may be formed in the galvanic isolation region 100 by patterning the substrate 102 using the patterning techniques described herein. For example, a patterned resist layer 136 may be formed over the substrate 102. The substrate 102 may be etched using an etching step (e.g., dry etch) to form the trench opening 134. The resist layer 136 may be subsequently removed (e.g, by an ashing step). In the embodiment shown in FIG. 7, the etching of the substrate 102 may be terminated when the trench opening 134 has a bottom in the doped well 102a of the substrate 102. Alternatively, in other embodiments, the etching of the substrate 102 may be terminated when the trench opening 134 has a bottom in the epitaxial region 102b of the substrate 102.

Figure 8:
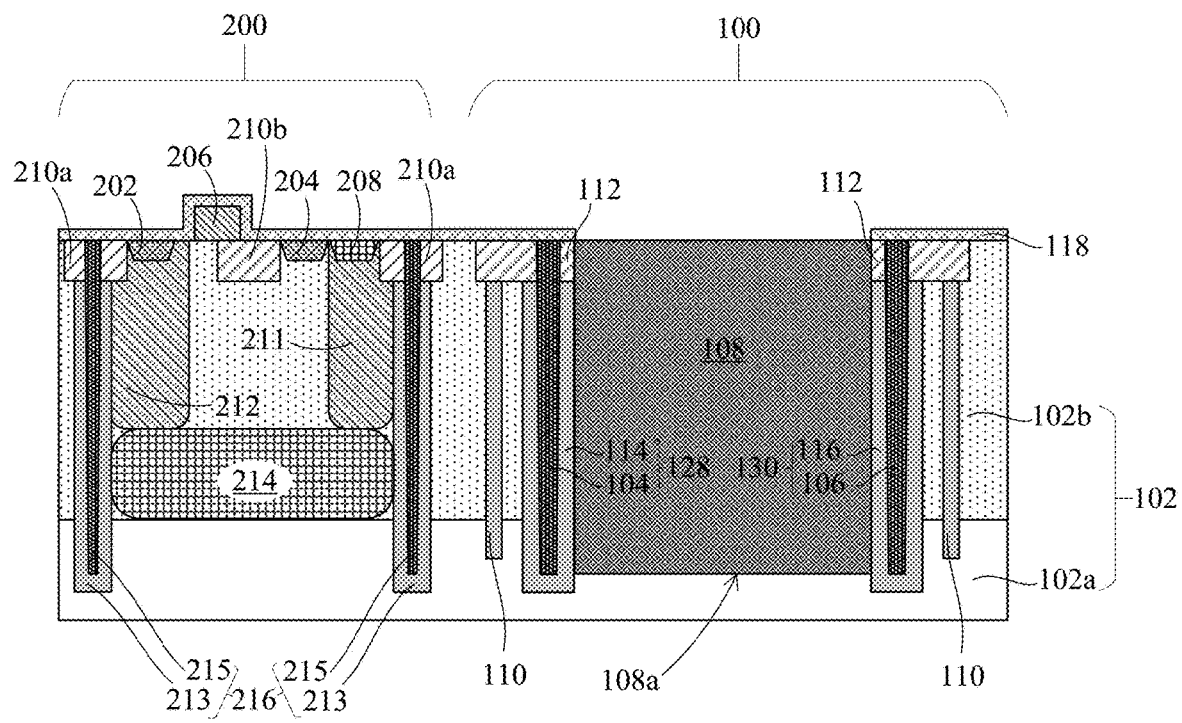

Referring to FIG. 8 (FIG. 8 continues from the structure shown in FIG. 7), an isolation layer 108 may be formed by filling the trench opening 134 with a dielectric material described herein. An IMD layer 117 may be formed on the isolation layer 108 and the passivation liner 118 using the deposition techniques described herein. In the embodiment shown in FIG. 8, the isolation layer 108 may have a bottom surface 108a that is in the doped well 102a of the substrate 102. In other embodiments, the isolation layer 108 may have a bottom surface 108a that is in the epitaxial region 102b of the substrate 102.

Figure 9A:
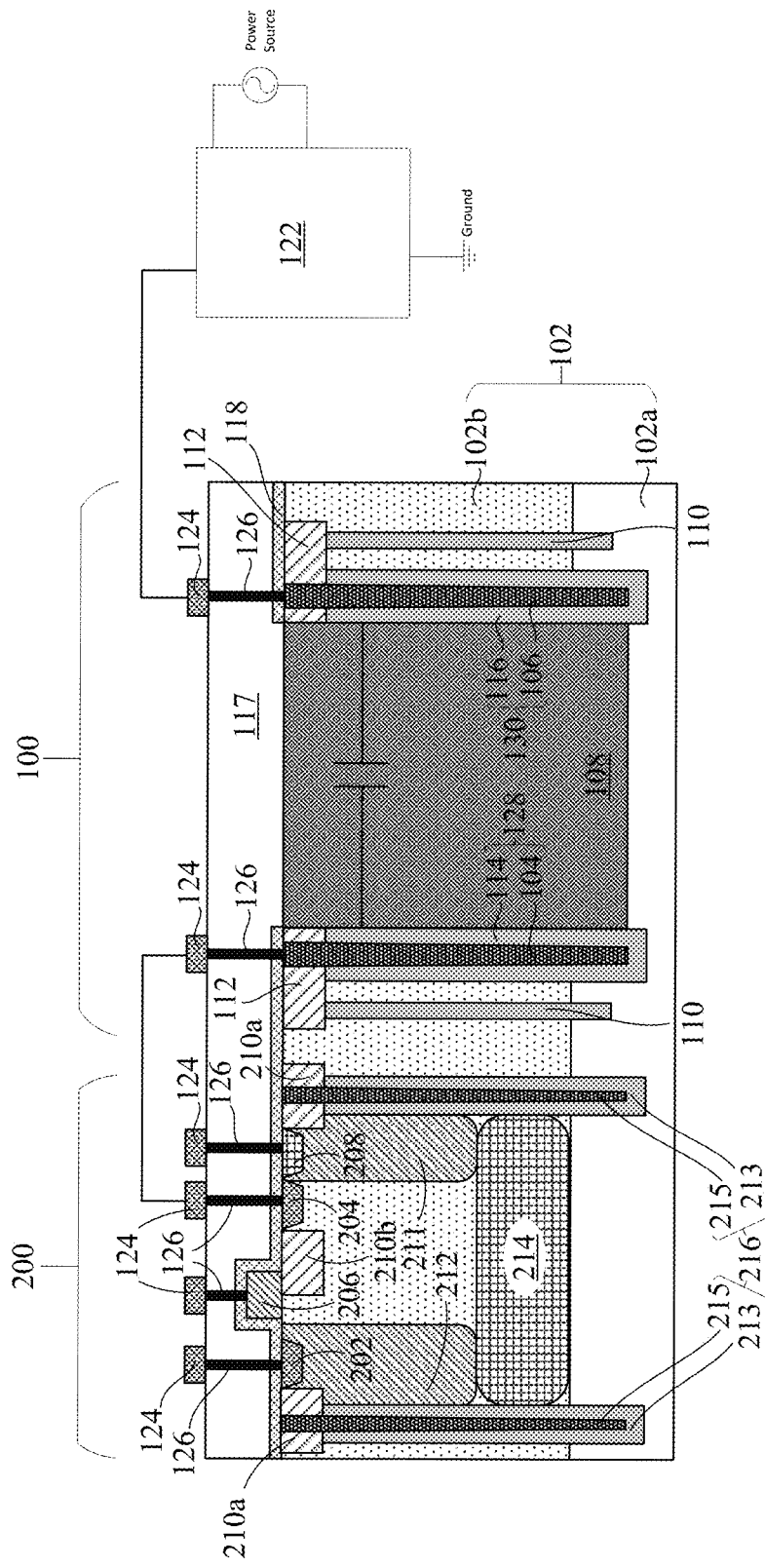

Referring to FIG. 9A (FIG. 9A continues from the structure shown in FIG. 8), contact structures 126 may be formed in the IMD layer 117, for example, by patterning the IMD layer 117 to create openings (not shown). The openings may be subsequently filled with conductive materials using deposition techniques to form the contact structures 126. In the device region 200, the contact structures 126 may be formed to contact the source region 202, the drain region 204, the body region 208, and the gate 206. In the galvanic isolation region 100, the contact structures 126 may be formed to contact the first electrode 104 in the first isolation structure 128 and the second electrode 106 in the second isolation structure 130. Conductive lines 124 may be formed upon the contact structures 126.

In the embodiment shown in FIG. 9A, the first electrode 104 may be electrically connected to the drain region 204 of the transistor, while the second electrode 106 may be electrically connected to a second circuit 122. Unlike the first isolation structure 128 and the second isolation structure 130, the conductive structure 215 in the deep trench isolation structure 216 may not be electrically connected to any external circuitry.

Figure 9B:
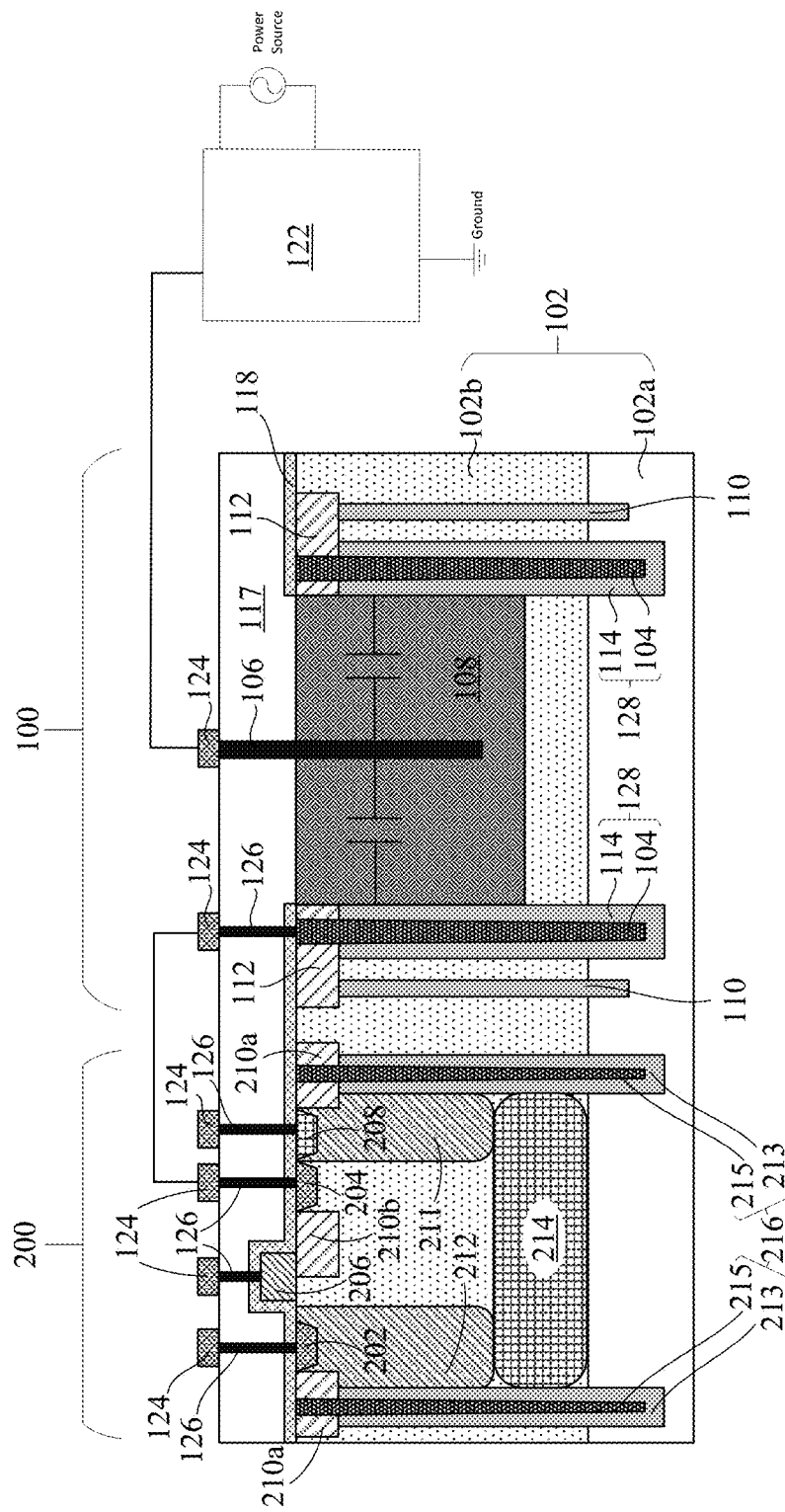
FIG. 9B is a cross-sectional view depicting a structure at a stage subsequent to FIG. 8 that integrates the semiconductor structure shown in FIG. 2A.

FIG. 9B shows an example structure associated with steps subsequent to FIG. 8 that may be used to create an example of a semiconductor device that incorporates the semiconductor structure shown in FIG. 2A.

Referring to FIG. 9B (FIG. 9B continues from the structure shown in FIG. 8), only the first isolation structure 128 and the dielectric isolation trench 110 may be formed in the substrate 102, i.e., the second isolation structure 130 may be absent. The first isolation structure 128 may laterally enclose the isolation layer 108, as described in FIG. 2B. Contact structures 126 may be formed in the IMD layer 117, for example, by patterning the IMD layer 117 to create openings (not shown). The openings may be subsequently filled with conductive materials using deposition techniques to form the contact structures 126. In the device region 200, the contact structures 126 may be formed to contact the source region 202, the drain region 204, the body region 208, and the gate 206. In the galvanic isolation region 100, the contact structures 126 may be formed to contact the first electrode 104 in the first isolation structure 128. Conductive lines 124 may be formed upon the contact structures 126.

Additionally, in the galvanic isolation region 100, a second electrode 106 may be formed in the IMD layer 117 and the isolation layer 108. For example, an electrode opening (not shown) may be formed by etching through the IMD layer 117 and the isolation layer 108. The patterned electrode opening may be subsequently filled with a conductive material as described herein to form the second electrode 106. A conductive line 124 may be formed upon the second electrode 106.

In the embodiment shown in FIG. 9B, the first electrode 104 may be electrically connected to the drain region 204 of the transistor in the device region 200, while the second electrode 106 may be electrically connected to a second circuit 122. Unlike the first isolation structure 128 and the second isolation structure 130, the conductive structure 215 in the deep trench isolation structure 216 may not be electrically connected to any external circuitry.

FIG. 10, FIG. 11, FIG. 12, and FIG. 13 show example structures associated with steps that may be used to create an example of a semiconductor device that incorporates the semiconductor structure shown in FIG. 1B.

Figure 10:
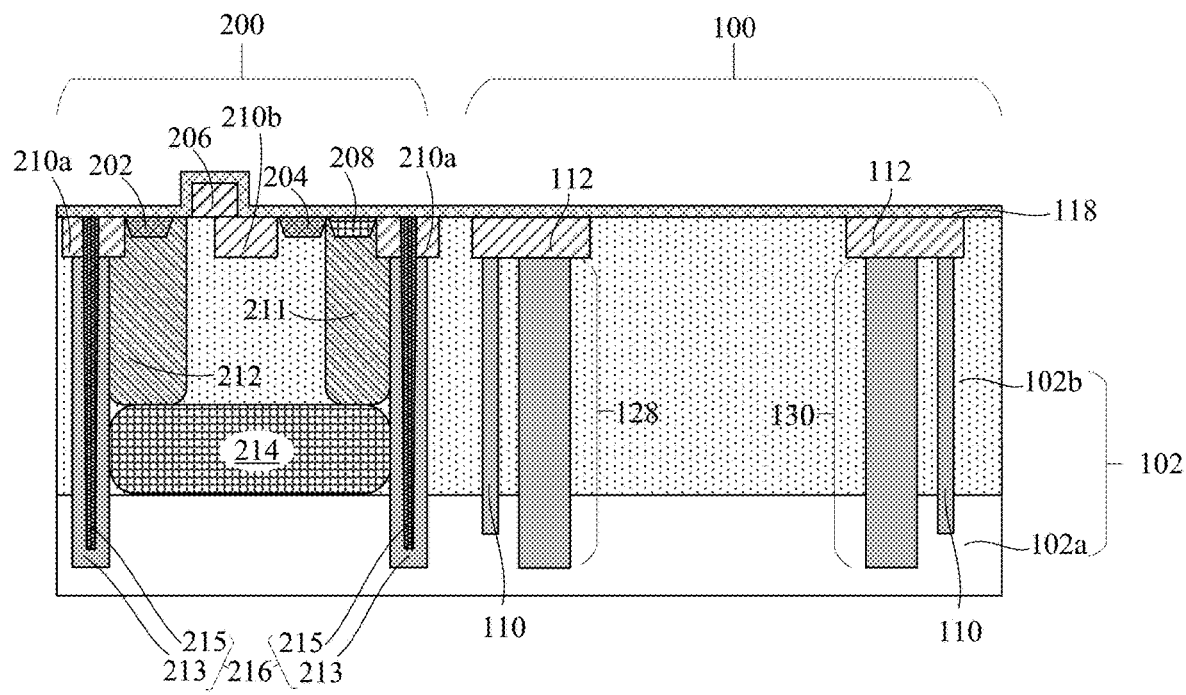
FIG. 10, FIG. 11, FIG. 12, and FIG. 13 are cross-sectional views that depict structures at various stages of forming a semiconductor device that integrates the semiconductor structure shown in FIG. 1B.

Referring to FIG. 10, a structure for forming the semiconductor device may be provided with a galvanic isolation region 100 and a device region 200. A passivation liner 118 may be formed on the substrate 102 to cover the galvanic isolation region 100 and the device region 200. The galvanic isolation region 100 and the device region 200 may be both formed on a substrate 102. The substrate 102 may include an epitaxial region 102b formed above a doped well 102a. The device region 200 of the structure shown in FIG. 10 may include the same features described in the structure shown in FIG. 6.

Figure 11:
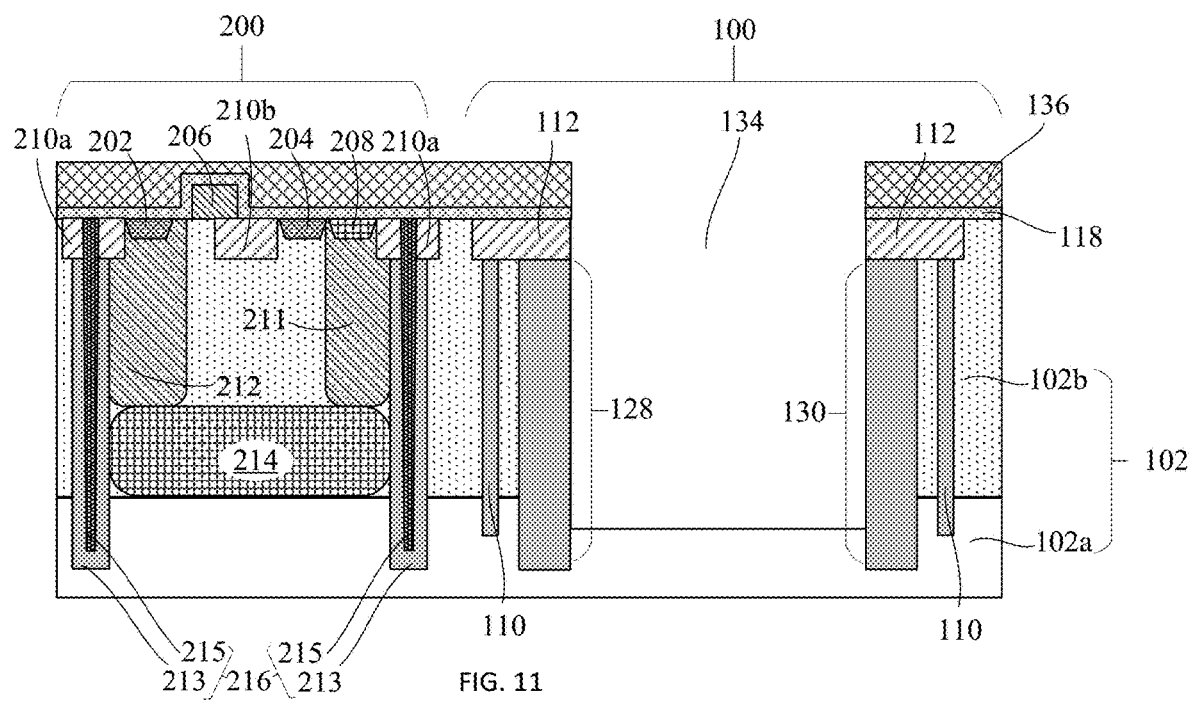

The galvanic isolation region 100 may include a shallow trench isolation layer 112 formed in the epitaxial region 102b. A first isolation structure 128, a second isolation structure 130, and a dielectric isolation trench 110 may be formed in the substrate 102. As shown in FIG. 11, the dielectric isolation trench 110, the first isolation structure 128, and the second isolation structure 130 may extend from a bottom of the shallow trench isolation layer 112, through the epitaxial region 102b, and terminate in the doped well 102a. The first isolation structure 128 and the second isolation structure 130 may include an oxide or a nitride material.

Referring to FIG. 11 (FIG. 11 continues from the structure shown in FIG. 10), a trench opening 134 may be formed in the galvanic isolation region 100 by patterning the substrate 102 using the patterning techniques described herein. For example, a patterned resist layer 136 may be formed over the substrate 102. The substrate 102 may be etched using an etching step (e.g., dry etch) to form the trench opening 134. The resist layer 136 may be subsequently removed, e.g, by an ashing step.

Figure 12:
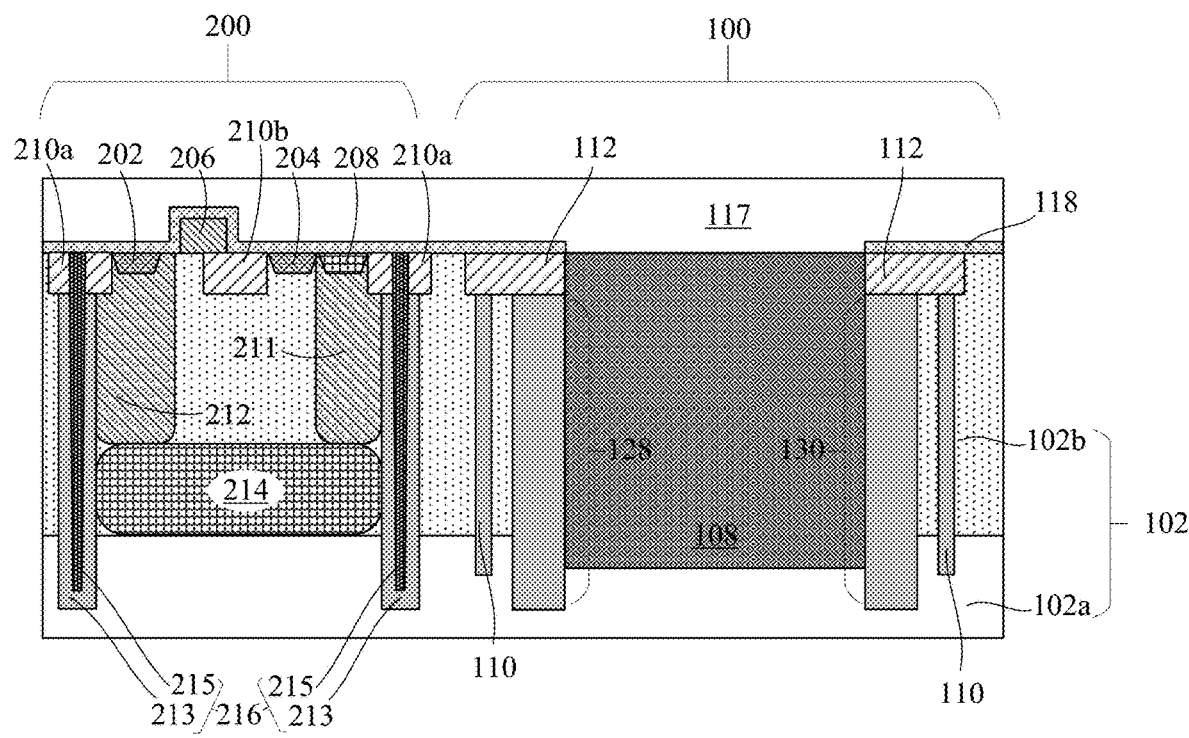

Referring to FIG. 12 (FIG. 12 continues from the structure shown in FIG. 11), an isolation layer 108 may be formed by filling the trench opening 134 with a dielectric material described herein. An IMD layer 117 may be formed on the isolation layer 108 and the passivation liner 118 using the deposition techniques described herein.

Figure 13:
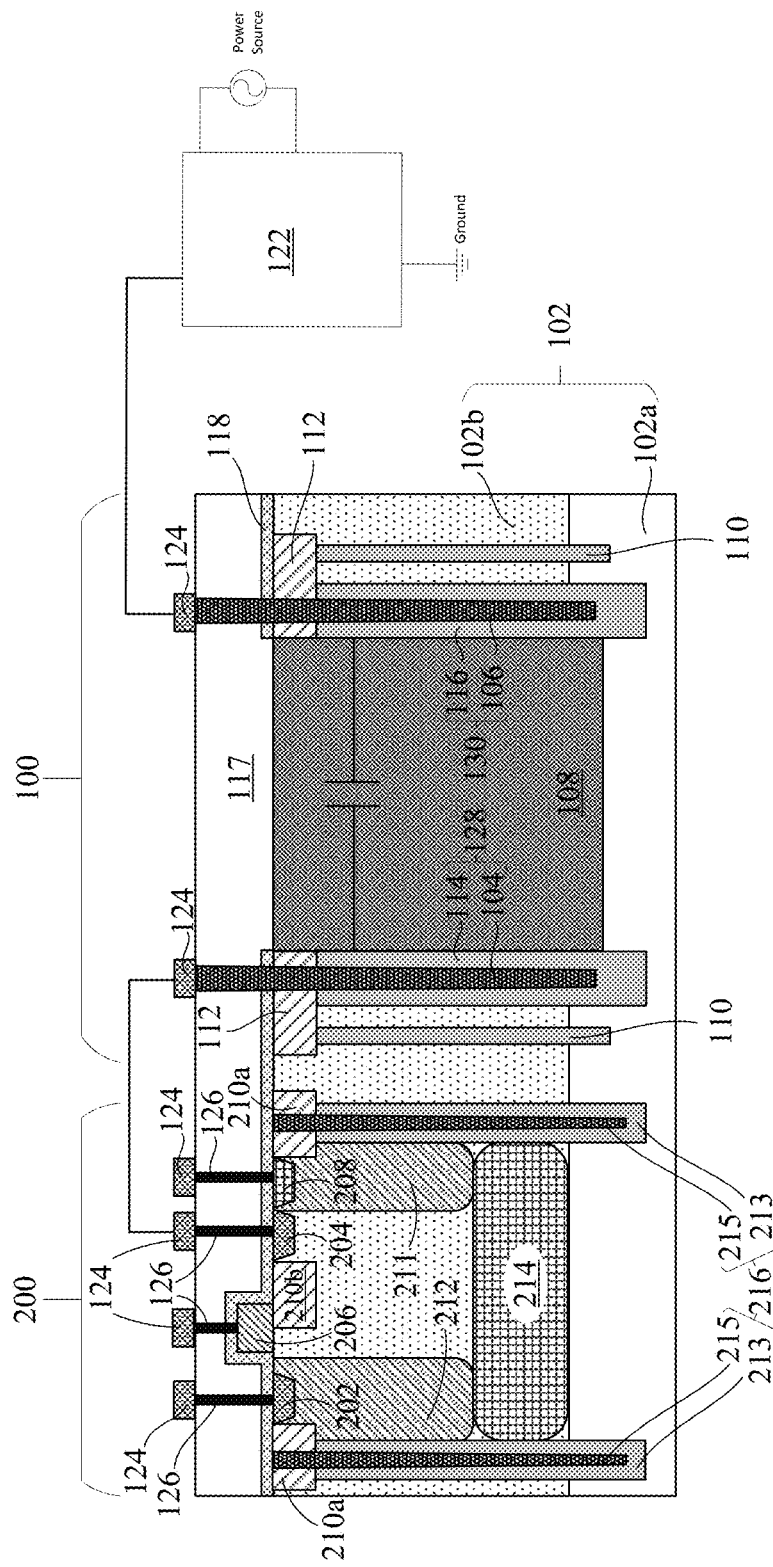

Referring to FIG. 13 (FIG. 13 continues from the structure shown in FIG. 12), in the device region 200, contact structures 126 may be formed to contact the source region 202, the drain region 204, the body region 208, and the gate 206. The contact structures 126 may be formed in the IMD layer 117, for example, by patterning the IMD layer 117 to create openings (not shown). The openings may be subsequently filled with conductive materials using deposition techniques to form the contact structures 126. Conductive lines 124 may be formed upon the contact structures 126.

In the galvanic isolation region 100, a first electrode 104 and a second electrode 106 may be formed in the first isolation structure 128 and the second isolation structure 130, respectively. For example, electrode openings (not shown) may be formed by etching through the IMD layer 117 and the isolation structures 128, 130, and then subsequently filled with a conductive material as described herein. Consequently, the first electrode 104 and a first dielectric liner 114 may be formed in the first isolation structure 128, while the second electrode 106 and a second dielectric liner 116 may be formed in the second isolation structure 130. Conductive lines 124 may be formed upon the first electrode 104 and the second electrode 106.

In the embodiment shown in FIG. 13, the first electrode 104 may be electrically connected to the drain region 204 of the transistor in the device region 200, while the second electrode 106 may be electrically connected to a second circuit 122. Unlike the first isolation structure 128 and the second isolation structure 130, the conductive structure 215 in the deep trench isolation structure 216 may not be electrically connected to any external circuitry.

FIG. 14, FIG. 15, FIG. 16, and FIG. 17 show example structures associated with steps that may be used to create an example of a semiconductor device that incorporates the semiconductor structure shown in FIG. 3A.

Figure 14:
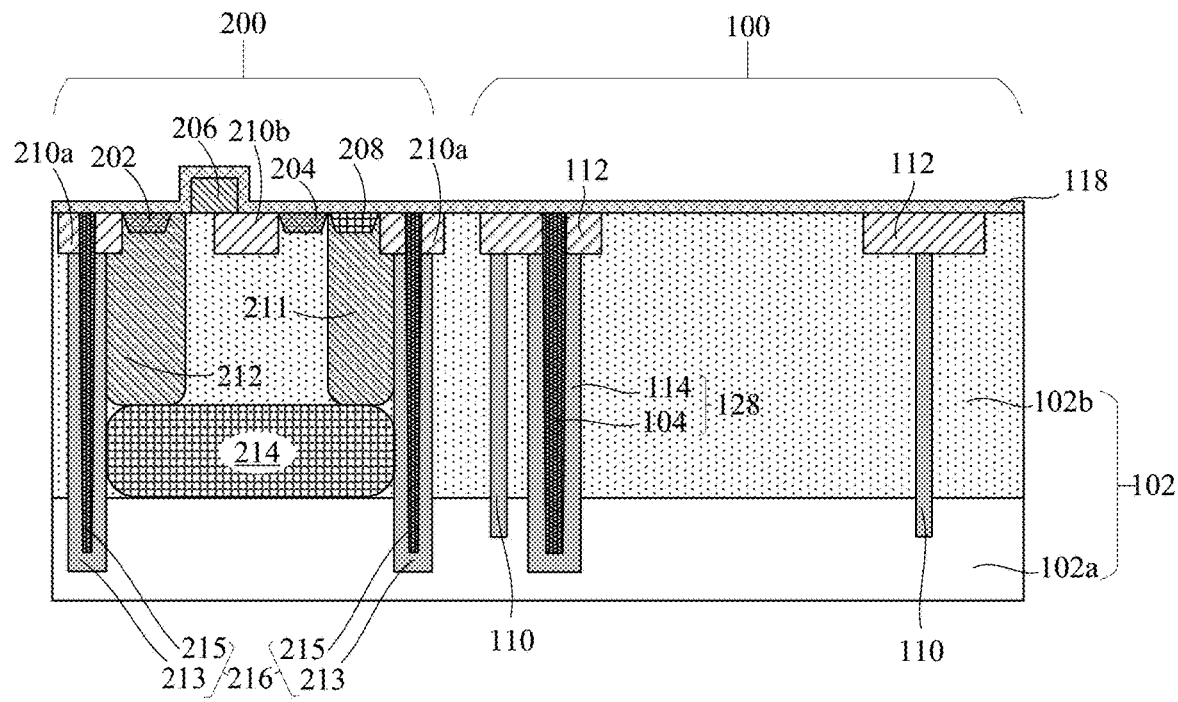
FIG. 14, FIG. 15, FIG. 16, and FIG. 17 are cross-sectional views that depict structures at various stages of forming a semiconductor device that integrates the semiconductor structure shown in FIG. 3A.

Referring to FIG. 14, a structure for forming the semiconductor device may be provided with a galvanic isolation region 100 and a device region 200. A passivation liner 118 may be formed on the substrate 102 to cover the galvanic isolation region 100 and the device region 200. The galvanic isolation region 100 and the device region 200 may be both formed on a substrate 102. The substrate 102 may include an epitaxial region 102b formed above a doped well 102a. The device region 200 of the structure shown in FIG. 14 may include the same features described in the structure shown in FIG. 6.

The galvanic isolation region 100 may include a shallow trench isolation layer 112 formed in the epitaxial region 102b. A first isolation structure 128 and a dielectric isolation trench 110 may be formed in the substrate 102. As shown in FIG. 14, the dielectric isolation trench 110 and the first isolation structure 128 may extend from a bottom of the shallow trench isolation layer 112, through the epitaxial region 102b, and terminate in the doped well 102a. The first isolation structure 128 may include a first electrode 104 and a first dielectric liner 114 covering sides and a bottom surface of the first electrode 104.

Figure 15:
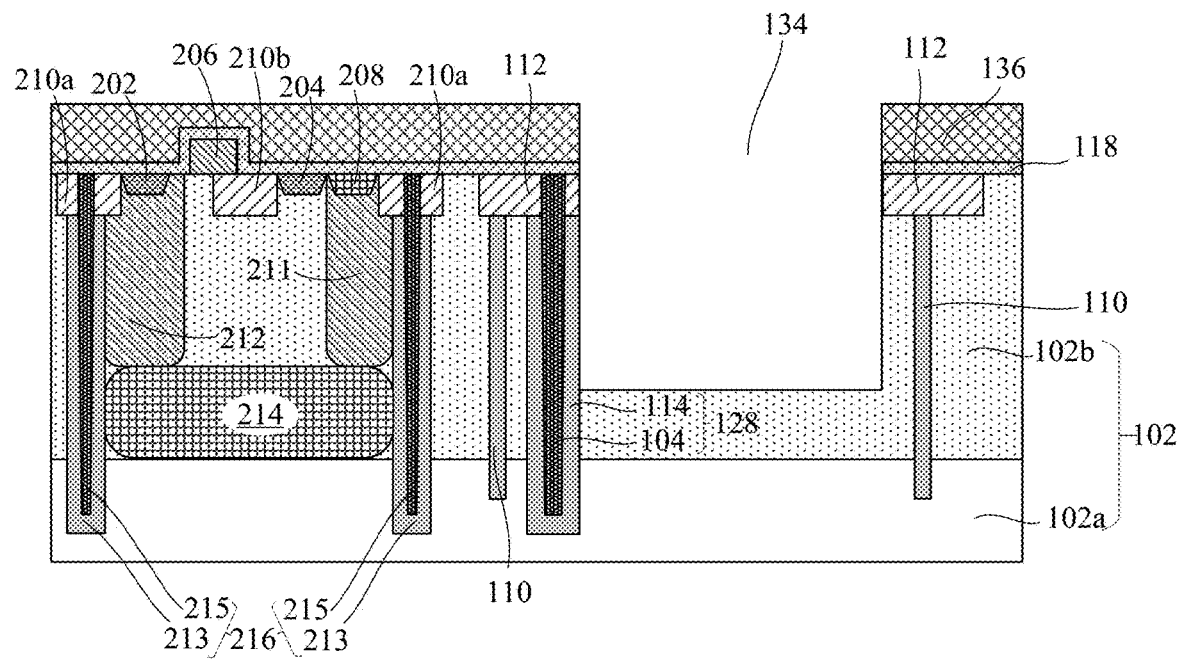

Referring to FIG. 15 (FIG. 15 continues from the structure shown in FIG. 14), a trench opening 134 may be formed in the galvanic isolation region 100 by patterning the substrate 102 using the patterning techniques described herein. For example, a patterned resist layer 136 may be formed over the substrate 102. The substrate 102 may be etched using an etching step (e.g., dry etch) to form the trench opening 134. The resist layer 136 may be subsequently removed, e.g, by an ashing step.

Figure 16:
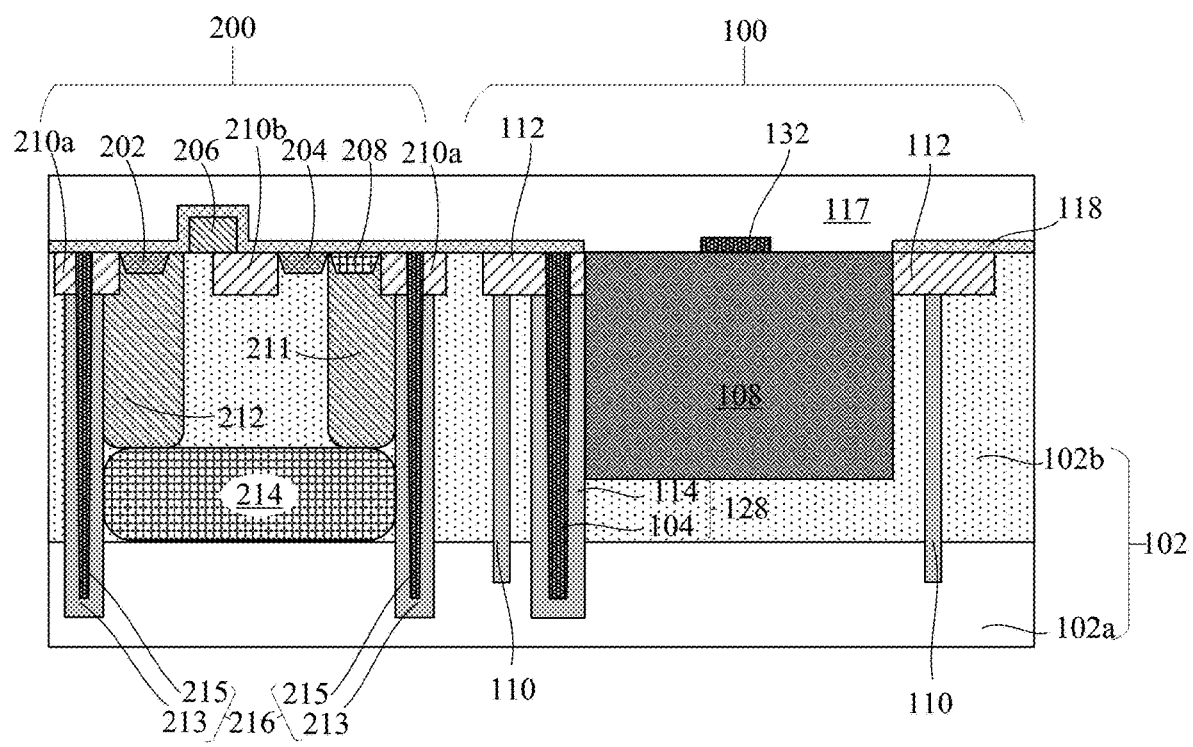

Referring to FIG. 16 (FIG. 16 continues from the structure shown in FIG. 15), an isolation layer 108 may be formed by filling the trench opening 134 with a dielectric material described herein. A conductive element 132 may be formed upon the isolation layer 108 using the deposition techniques described herein. The upper surface of the isolation layer 108 may be partially covered by the conductive element 132. Subsequently, an IMD layer 117 may be formed on the conductive element 132, the isolation layer 108, and the passivation liner 118 using the deposition techniques described herein.

Figure 17:
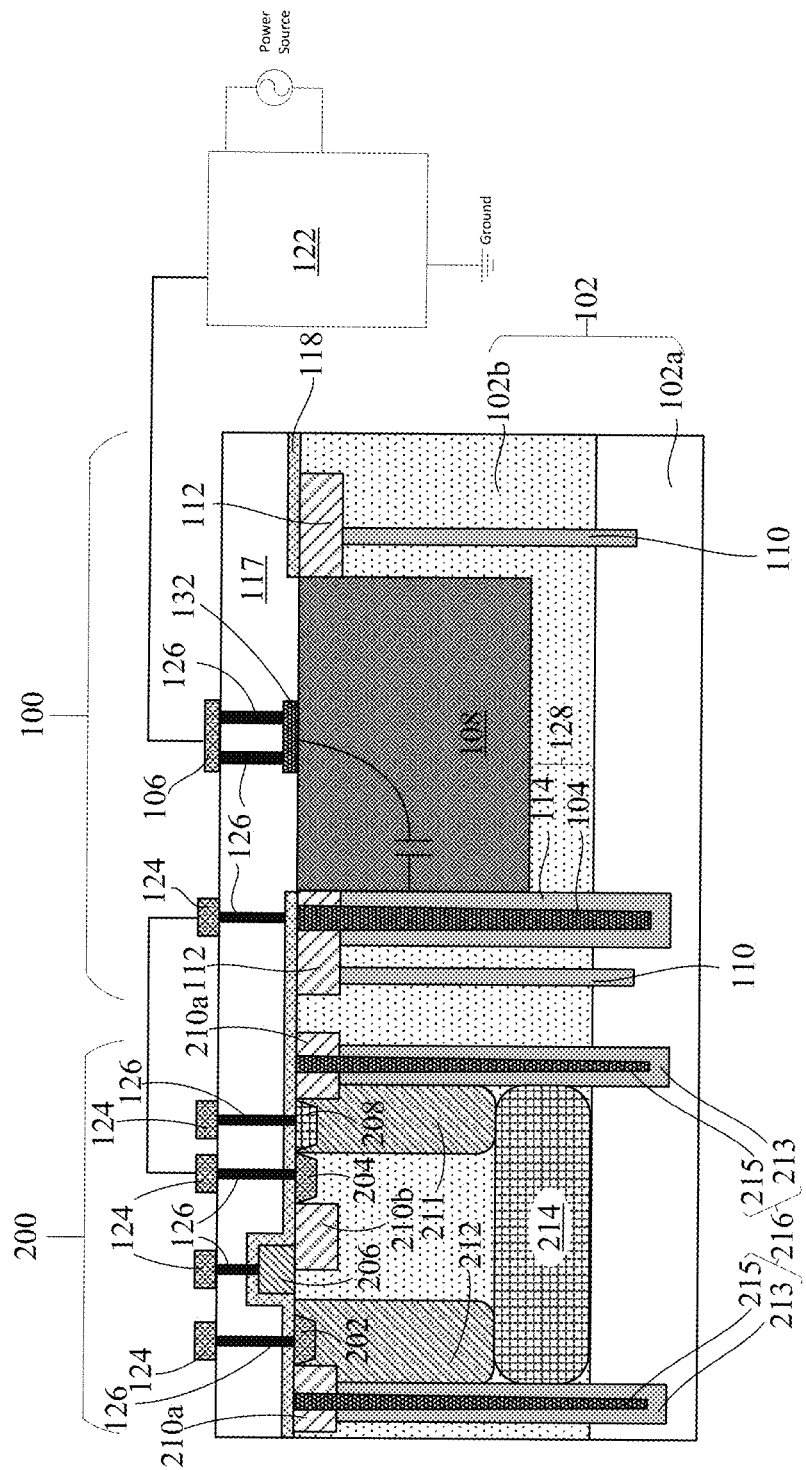

Referring to FIG. 17 (FIG. 17 continues from the structure shown in FIG. 16), in the device region 200, contact structures 126 may be formed to contact the source region 202, the drain region 204, the body region 208, and the gate

206. In the galvanic isolation region 100, the contact structures 126 may be formed to contact the first electrode 104 in the first isolation structure 128 and the conductive element 132. The contact structures 126 may be formed in the IMD layer 117, for example, by patterning the IMD layer 117 to create openings (not shown). The openings may be subsequently filled with conductive materials using deposition techniques to form the contact structures 126. Conductive lines 124 may be formed upon the contact structures 126.

A second electrode 106 may be formed upon the IMD layer 117 and the contact structures 126, using the deposition techniques described herein. In particular, the second electrode 106 may be deposited above the conductive element 132 such that the conductive element 132 may be substantially parallel with and covering the deposited second electrode 106.

In the embodiment shown in FIG. 17, the first electrode 104 may be electrically connected to the drain region 204 of the transistor in the device region 200, while the second electrode 106 may be electrically connected to a second circuit 122. Unlike the first isolation structure 128 and the second isolation structure 130, the conductive structure 215 in the deep trench isolation structure 216 may not be electrically connected to any external circuitry.

Figure 18:
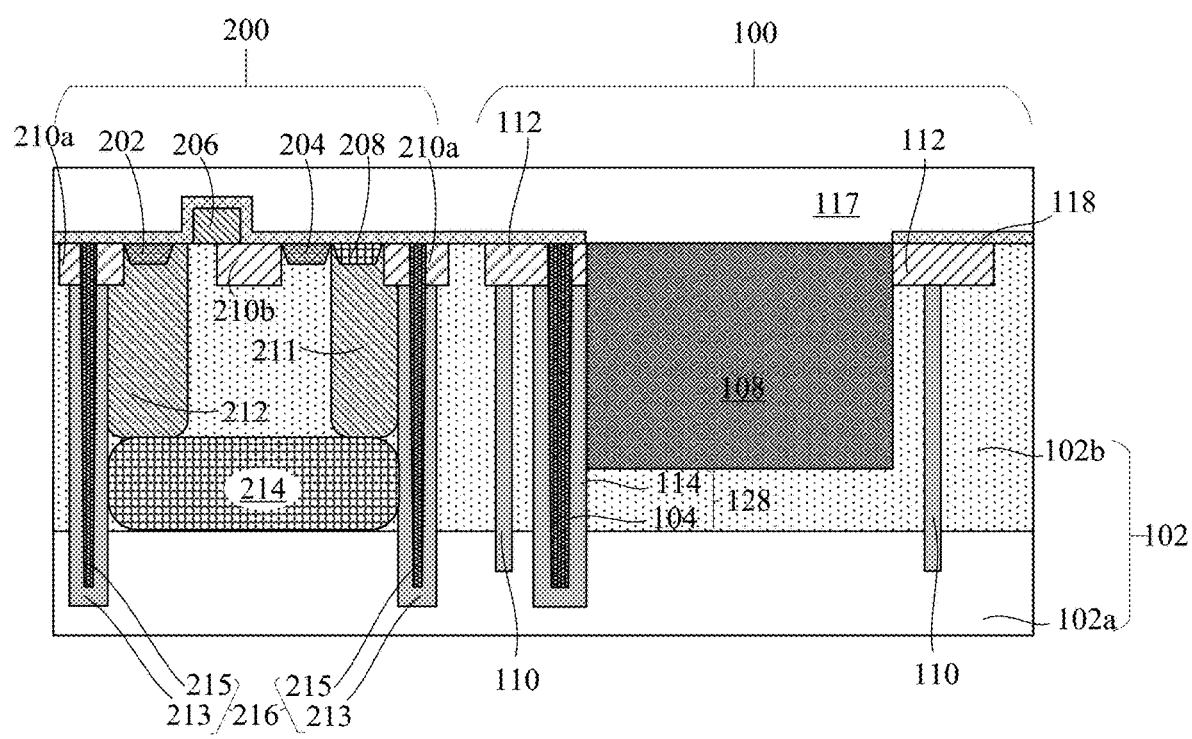
FIGS. 18 and 19 are cross-sectional views that depict structures at various stages subsequent to FIG. 15 of forming a semiconductor device that integrates the semiconductor structure shown in FIG. 4.
Figure 19:
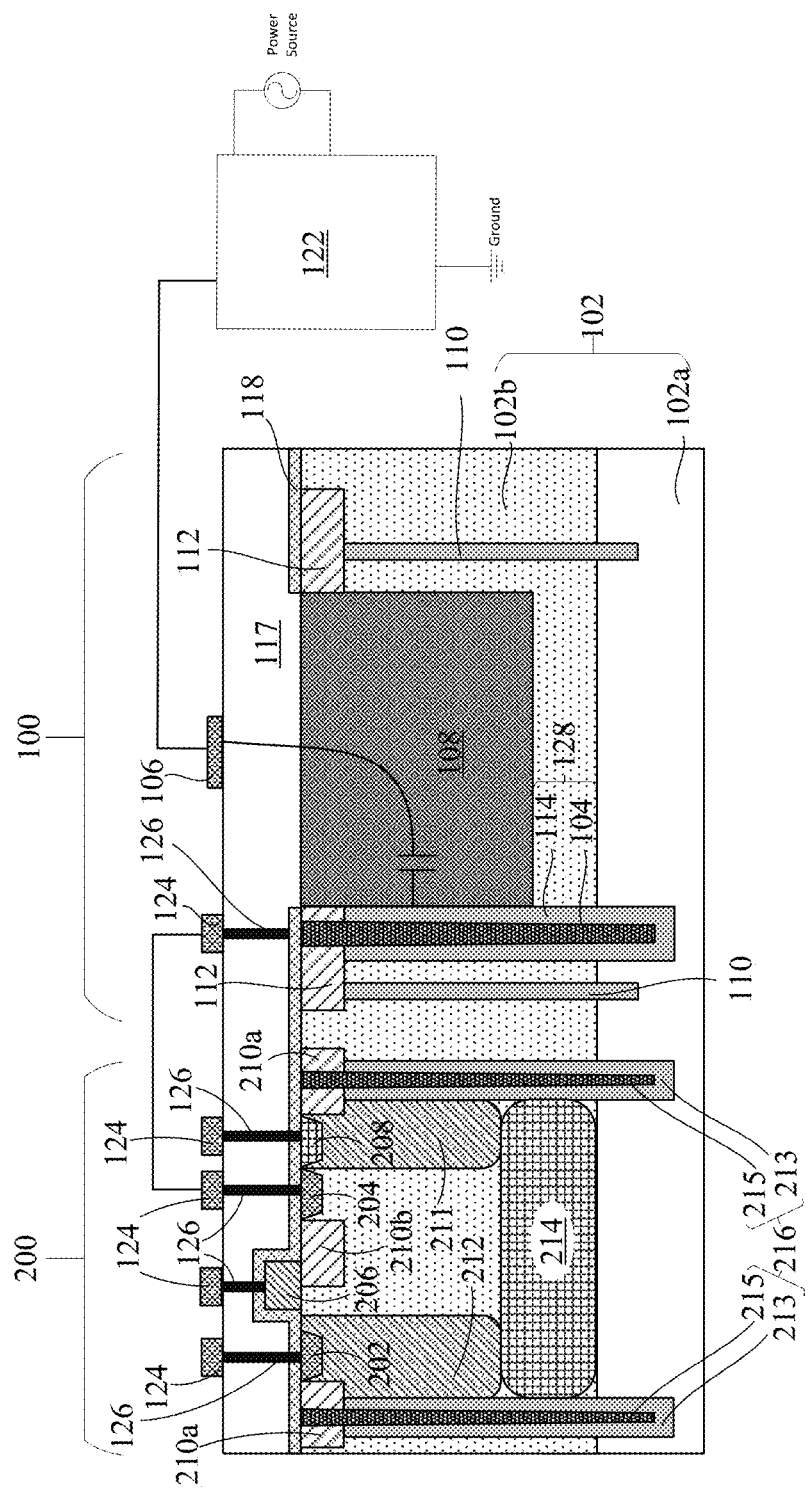

FIG. 18 and FIG. 19 show example structures associated with steps subsequent to FIG. 15 that may be used to create an example of a semiconductor device that incorporates the semiconductor structure shown in FIG. 4.

Referring to FIG. 18 (FIG. 18 continues from the structure shown in FIG. 15), an isolation layer 108 may be formed by filling the trench opening 134 with a dielectric material described herein. An IMD layer 117 may be formed on the isolation layer 108 and the passivation liner 118 using the deposition techniques described herein.

Referring to FIG. 19 (FIG. 19 continues from the structure shown in FIG. 18), in the device region 200, contact structures 126 may be formed to contact the source region 202, the drain region 204, the body region 208, and the gate 206. In the galvanic isolation region 100, the contact structures 126 may be formed to contact the first electrode 104 in the first isolation structure 128. The contact structures 126 may be formed in the IMD layer 117, for example, by patterning the IMD layer 117 to create openings (not shown). The openings may be subsequently filled with conductive materials using deposition techniques to form the contact structures 126. Conductive lines 124 may be formed upon the contact structures 126.

A second electrode 106 may be formed upon the IMD layer 117 and the contact structures 126, using the deposition techniques described herein. In particular, the second electrode 106 may be deposited such that it is aligned directly above the isolation layer 108, in which a surface of the second electrode 106 may be substantially parallel with an upper surface of the isolation layer 108.

In the embodiment shown in FIG. 19, the first electrode 104 may be electrically connected to the drain region 204 of the transistor in the device region 200, while the second electrode 106 may be electrically connected to a second circuit 122. Unlike the first isolation structure 128 and the second isolation structure 130, the conductive structure 215 in the deep trench isolation structure 216 is not electrically connected to any external circuitry.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, high power devices, FinFET transistor devices, CMOS devices, etc.

What is claimed is:

1. A semiconductor structure comprising:
   a first isolation structure in a substrate, the first isolation structure including a first electrode;
   an isolation layer in the substrate, the isolation layer has an upper surface and is positioned laterally adjacent to the first isolation structure;
   a second electrode above the isolation layer, the second electrode has a surface that is substantially parallel with the upper surface of the isolation layer, wherein the second electrode is isolated from the first electrode by the isolation layer;
   a first circuit comprising a transistor on the substrate, the first electrode is electrically connected to the transistor; and
   a second circuit in electrical communication with the second electrode, the second circuit operates at a different voltage than the first circuit.

2. The semiconductor structure of claim 1, wherein the first electrode is in electrical communication with the first circuit.

3. The semiconductor structure of claim 1, further comprising a dielectric isolation trench disposed in the substrate, the dielectric isolation trench laterally enclosing the first isolation structure and the isolation layer.

4. The semiconductor structure of claim 3, wherein the first isolation structure has a bottom surface, and the dielectric isolation trench has a bottom surface that is higher than the bottom surface of the first isolation structure.

5. The semiconductor structure of claim 4, further comprising a shallow isolation trench in the substrate, the shallow isolation trench having a bottom, wherein the dielectric isolation trench and the isolation layer extends from the bottom of the shallow isolation trench and terminates in the substrate.

6. The semiconductor structure of claim 4, wherein the first electrode has sides and a bottom surface, and the first isolation structure includes a first dielectric liner covering the sides and the bottom surface of the first electrode.

7. The semiconductor structure of claim 1, wherein the second electrode is aligned directly above the isolation layer.

8. The semiconductor structure of claim 7, further comprising a conductive element disposed upon the upper surface of the isolation layer, wherein the conductive element is positioned below the second electrode, and the conductive element is electrically connected to the second electrode.

9. The semiconductor structure of claim 1, wherein the first electrode is capacitively coupled to the second electrode.

10. A semiconductor structure comprising:
   a first isolation structure in a substrate, the first isolation structure including a first electrode;
   an isolation layer in the substrate, the isolation layer has an upper surface and is positioned laterally adjacent to the first isolation structure;
   a second electrode above the isolation layer, the second electrode has a surface that is substantially parallel with the upper surface of the isolation layer, wherein the second electrode is isolated from the first electrode by the isolation layer;
   a conductive element disposed upon the upper surface of the isolation layer, wherein the conductive element is positioned below the second electrode, and the conductive element is electrically connected to the second electrode;
   a first circuit comprising a transistor on the substrate, the first electrode is electrically connected to the transistor; and
   a second circuit in electrical communication with the second electrode, the second circuit operates at a different voltage than the first circuit.

11. The semiconductor structure of claim 10, further comprising a contact structure vertically between the conductive element and the second electrode, wherein the conductive element is electrically connected to the second electrode by the contact structure.

12. The semiconductor structure of claim 11, wherein the conductive element is structured as a conductive plate.

13. The semiconductor structure of claim 12, wherein the conductive plate has a surface that is parallel with the surface of the second electrode.

14. The semiconductor structure of claim 10, wherein the conductive element partially covers the upper surface of the isolation layer.

15. The semiconductor structure of claim 10, wherein the first electrode is in electrical communication with the first circuit.

16. The semiconductor structure of claim 10, wherein the first electrode is electrically isolated from the conductive element by the isolation layer.

17. The semiconductor structure of claim 16, wherein the first electrode is capacitively coupled to the conductive element.

18. A semiconductor structure comprising:
   an isolation structure in a substrate, the isolation structure has a bottom surface, the isolation structure including a first electrode;
   an isolation layer in the substrate, the isolation layer has an upper surface and a bottom surface, the isolation layer is positioned laterally adjacent to the isolation structure, wherein the bottom surface of the isolation layer is higher than the bottom surface of the isolation structure; and
   a second electrode above the isolation layer, the second electrode has a surface that is substantially parallel with the upper surface of the isolation layer, wherein the second electrode is isolated from the first electrode by the isolation layer.

* * * * *